(12) United States Patent
Takamoto et al.

(10) Patent No.: US 8,986,486 B2
(45) Date of Patent: Mar. 24, 2015

(54) FILM FOR SEMICONDUCTOR DEVICE PRODUCTION, METHOD FOR PRODUCING FILM FOR SEMICONDUCTOR DEVICE PRODUCTION, AND METHOD FOR SEMICONDUCTOR DEVICE PRODUCTION

(75) Inventors: Naohide Takamoto, Osaka (JP); Goji Shiga, Osaka (JP); Fumiteru Asai, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/170,581

(22) Filed: Jun. 28, 2011

(65) Prior Publication Data
US 2012/0024469 A1 Feb. 2, 2012

(30) Foreign Application Priority Data
Jul. 28, 2010 (JP) .................. 2010-169556

(51) Int. Cl.
*B32B 38/04* (2006.01)
*C09J 7/02* (2006.01)
(Continued)

(52) U.S. Cl.
CPC .............. *C09J 7/02* (2013.01); *H01L 21/561* (2013.01); *H01L 21/563* (2013.01); *H01L 21/6835* (2013.01); *H01L 23/293* (2013.01); *H01L 23/3164* (2013.01); *H01L 24/13* (2013.01); *H01L 24/27* (2013.01); *H01L 24/29* (2013.01); *H01L 24/81* (2013.01); *H01L 24/92* (2013.01); *C09J 2203/326* (2013.01); *H01L 23/3114* (2013.01); *H01L 23/544* (2013.01); *H01L 24/16* (2013.01); *H01L 24/83* (2013.01);
(Continued)

(58) Field of Classification Search
USPC ............. 428/41.7, 41.8, 101, 213, 42.3, 64.1, 428/212, 220; 156/257, 268, 248, 249, 264, 156/265, 300
See application file for complete search history.

(56) References Cited

U.S. PATENT DOCUMENTS

| | | |
|---|---|---|
| 7,935,574 B2 | 5/2011 | Saiki et al. |
| 8,323,761 B2 | 12/2012 | Nakayama et al. |

(Continued)

FOREIGN PATENT DOCUMENTS

| | | |
|---|---|---|
| CN | 101040023 A | 9/2007 |
| JP | 2004-063551 A | 2/2004 |

(Continued)

OTHER PUBLICATIONS

Office Action dated Mar. 29, 2013 issued by the Japanese Patent Office in corresponding Japanese Patent Application No. 2010-169556.

(Continued)

*Primary Examiner* — Linda L Gray
(74) *Attorney, Agent, or Firm* — Sughrue Mion, PLLC

(57) ABSTRACT

The present invention relates to a film for semiconductor device production, which includes: a separator; and a plurality of adhesive layer-attached dicing tapes each including a dicing tape and an adhesive layer laminated on the dicing tape, which are laminated on the separator at a predetermined interval in such a manner that the adhesive layer attaches to the separator, in which the separator has a cut formed along the outer periphery of the dicing tape, and the depth of the cut is at most ⅔ of the thickness of the separator.

3 Claims, 2 Drawing Sheets

(51) Int. Cl.
*H01L 21/56* (2006.01)
*H01L 21/683* (2006.01)
*H01L 23/29* (2006.01)
*H01L 23/31* (2006.01)
*H01L 23/00* (2006.01)
*H01L 23/544* (2006.01)

(52) U.S. Cl.
CPC .............. *H01L2221/68336* (2013.01); *H01L 2221/68377* (2013.01); *H01L 2221/68381* (2013.01); *H01L 2221/68386* (2013.01); *H01L 2223/54406* (2013.01); *H01L 2223/5442* (2013.01); *H01L 2223/5448* (2013.01); *H01L 2224/131* (2013.01); *H01L 2224/16227* (2013.01); *H01L 2224/16245* (2013.01); *H01L 2224/27003* (2013.01); *H01L 2224/27436* (2013.01); *H01L 2224/2929* (2013.01); *H01L 2224/293* (2013.01); *H01L 2224/29386* (2013.01); *H01L 2224/73204* (2013.01); *H01L 2224/81095* (2013.01); *H01L 2224/81191* (2013.01); *H01L 2224/81815* (2013.01); *H01L 2224/8191* (2013.01); *H01L 2224/83191* (2013.01); *H01L 2224/8385* (2013.01); *H01L 2224/92* (2013.01); *H01L 2224/92125* (2013.01); *H01L 2924/01013* (2013.01); *H01L 2924/01029* (2013.01); *H01L 2924/0103* (2013.01); *H01L 2924/01047* (2013.01); *H01L 2924/0105* (2013.01); *H01L 2924/01051* (2013.01); *H01L 2924/01056* (2013.01); *H01L 2924/01079* (2013.01); *H01L 2924/01082* (2013.01); *H01L 2224/2919* (2013.01); *H01L 2924/01005* (2013.01); *H01L 2924/01006* (2013.01); *H01L 2924/0102* (2013.01); *H01L 2924/01023* (2013.01); *H01L 2924/01024* (2013.01); *H01L 2924/01033* (2013.01); *H01L 2924/01042* (2013.01); *H01L 2924/01045* (2013.01); *H01L 2924/01074* (2013.01); *H01L 2924/01075* (2013.01); *H01L 2924/014* (2013.01); *H01L 2924/0665* (2013.01); *H01L 2224/29101* (2013.01); *H01L 2224/16225* (2013.01); *H01L 2224/13111* (2013.01); *H01L 2224/13144* (2013.01); *H01L 2224/13147* (2013.01); *H01L 2924/0001* (2013.01)
USPC ............ 156/257; 156/268; 156/248; 156/249; 156/264; 156/265; 156/300; 428/41.7; 428/41.8; 428/42.3; 428/64.1

(56) References Cited

U.S. PATENT DOCUMENTS

| | | |
|---|---|---|
| 8,465,615 B2 | 6/2013 | Tanaka et al. |
| 8,470,115 B2 | 6/2013 | Tanaka et al. |
| 2004/0104326 A1 | 6/2004 | Demel et al. |
| 2006/0079011 A1 | 4/2006 | Tandy et al. |
| 2006/0102987 A1 | 5/2006 | Saiki et al. |
| 2008/0261039 A1 | 10/2008 | Tanaka et al. |
| 2009/0053518 A1 | 2/2009 | Saiki et al. |
| 2009/0208688 A1 | 8/2009 | Nakayama et al. |
| 2012/0068312 A1* | 3/2012 | Tanaka et al. .................. 257/620 |
| 2012/0073743 A1 | 3/2012 | Tanaka et al. |
| 2012/0135176 A1 | 5/2012 | Tanaka et al. |
| 2013/0295314 A1 | 11/2013 | Tanaka et al. |
| 2013/0302570 A1 | 11/2013 | Tanaka et al. |

FOREIGN PATENT DOCUMENTS

| | | |
|---|---|---|
| JP | 2004-072108 A | 3/2004 |
| JP | 2004-142430 A | 5/2004 |
| JP | 2004-214288 A | 7/2004 |
| JP | 2004-221169 A | 8/2004 |
| JP | 2005-350520 A | 12/2005 |
| JP | 2006-111727 A | 4/2006 |
| JP | 2006-140348 A | 6/2006 |
| JP | 2006-224581 A | 8/2006 |
| JP | 2007-100029 A | 4/2007 |
| JP | 2007-158026 A | 6/2007 |
| JP | 2007-250970 A | 9/2007 |
| JP | 2007-261035 A | 10/2007 |
| JP | 2007-288170 A | 11/2007 |
| JP | 2008-006386 A | 1/2008 |
| JP | 2008-166451 A | 7/2008 |
| JP | 2008274255 A * | 11/2008 |
| JP | 2009-88480 A | 4/2009 |
| JP | 2010-031183 A | 2/2010 |
| JP | 2011-89048 A | 5/2011 |
| TW | I303454 B | 11/2008 |

OTHER PUBLICATIONS

Communication issued in corresponding JP application 2010-169556 dated Jun. 25, 2013.

Pretrial Report drafted Dec. 9, 2013 and issued by the Japanese Patent Office in corresponding Japanese Application No. 2013-018530.

Office Action dated Jan. 16, 2014 issued by the Taiwan Patent Office in corresponding Taiwanese Application No. 100123190.

Notification of First Office Action dated Jul. 21, 2014 issued by the State Intellectual Property Office of P.R. China in counterpart Chinese Patent Application No. 201110185003.3, 15pages.

Office Action dated Oct. 23, 2014 issued by Taiwanese Patent Office in counterpart Taiwanese Patent Application No. 100123190, 7 pages.

Notice of Preliminary Rejection dated Dec. 10, 2014, issued by the Korean Intellectual Property Office in counterpart Korean Application No. 10-2011-0063951, 9 pages.

* cited by examiner

FILM FOR SEMICONDUCTOR DEVICE PRODUCTION, METHOD FOR PRODUCING FILM FOR SEMICONDUCTOR DEVICE PRODUCTION, AND METHOD FOR SEMICONDUCTOR DEVICE PRODUCTION

FIELD OF THE INVENTION

The present invention relates to a film for semiconductor device production, a method for producing a film for semiconductor device production, and a method for semiconductor device production.

BACKGROUND OF THE INVENTION

Recently, thinning and miniaturization of a semiconductor device and its package have been increasingly demanded. Therefore, as the semiconductor device and its package, flip chip type semiconductor devices in which a semiconductor element such as a semiconductor chip is mounted (flip chip-connected) on a substrate by means of flip chip bonding have been widely utilized. In such flip chip connection, a semiconductor chip is fixed to a substrate in a form where a circuit face of the semiconductor chip is opposed to an electrode-formed face of the substrate. In such a semiconductor device or the like, there may be a case where the back surface of the semiconductor chip is protected with a protective film to prevent the semiconductor chip from damaging or the like (see, Patent Document 1 to 10).

Patent Document 1: JP-A-2008-166451
Patent Document 2: JP-A-2008-006386
Patent Document 3: JP-A-2007-261035
Patent Document 4: JP-A-2007-250970
Patent Document 5: JP-A-2007-158026
Patent Document 6: JP-A-2004-221169
Patent Document 7: JP-A-2004-214288
Patent Document 8: JP-A-2004-142430
Patent Document 9: JP-A-2004-072108
Patent Document 10: JP-A-2004-063551

The present inventors investigated films for protecting the back surface of semiconductor chips. As a result, the inventors have invented a method of attaching a film to the back surface of a semiconductor chip by using a film for semiconductor device production, in which a plurality of adhesive layer-attached dicing tapes each comprises an adhesive layer laminated on a dicing tape are laminated on a separator at a predetermined interval.

The adhesive layer-attached dicing tape is precut in accordance with the shape (for example, a circular form) of the semiconductor wafer to which it is stuck. The adhesive layer-attached dicing tape is peeled from the separator when it is stuck to a semiconductor wafer. However, depending on the physical properties of the adhesive layer-attached dicing tape and on the condition of the apparatus, there has occurred an additional problem in that the adhesive layer-attached dicing tape could not be well separated from the separator.

SUMMARY OF THE INVENTION

The invention has been made in consideration of the above-mentioned problem, and its object is to provide a film for semiconductor device production which comprises a separator, and a plurality of adhesive layer-attached dicing tapes each including an adhesive layer laminated on a dicing tape, which are laminated on the separator at a predetermined interval(s), wherein the adhesive layer-attached dicing tape can be favorably peeled from the separator, a method for producing the film, and a method of producing a semiconductor device by using the film for semiconductor device production.

The present inventors investigated films for semiconductor device production for the purpose of solving the above-mentioned problems in the art. As a result, the inventors have found that when the following constitution is employed, then the adhesive layer-attached dicing tape can be favorably peeled from the separator, and have completed the present invention.

Namely, the present invention provides a film for semiconductor device production, which comprises: a separator; and a plurality of adhesive layer-attached dicing tapes each comprising a dicing tape and an adhesive layer laminated on the dicing tape, which are laminated on the separator at a predetermined interval in such a manner that the adhesive layer attaches to the separator, in which the separator has a cut formed along the outer periphery of the dicing tape, and the depth of the cut is at most ⅔ of the thickness of the separator.

According to the above-mentioned constitution, the separator is so processed as to have a cut formed along the outer periphery of the dicing tape. Accordingly, starting from the cut, the adhesive layer-attached dicing tape can be easily peeled from the separator. Since the depth of the cut (cutting depth) is at most ⅔ of the thickness of the separator, the separator is prevented from being torn from the cut part (cut) when the adhesive layer-attached dicing tape is peeled from the separator. As a result, the adhesive layer-attached dicing tape can be favorably peeled (picked up) from the separator. Herein, the term "cut" in this specification means a part where the separator is cut to a certain depth not exceeding the thickness of the separator. The term "cut" may be referred to as "groove".

In addition, the present invention also provides a method for producing the film for semiconductor device production, the method comprising: preparing a separator-attached film that comprises a separator, and a plurality of adhesive layer-attached dicing tapes each comprising a dicing tape and an adhesive layer laminated on the dicing tape, which are laminated on the separator in such a manner that the adhesive layer attaches to the separator, and cutting the separator-attached film in accordance with the size corresponding to the semiconductor wafer to which the film is stuck, in which the film is cut to the depth of at most ⅔ of the thickness of the separator from the adhesive layer-attached dicing tape side.

According to the above-mentioned constitution, when the separator-attached film is cut in accordance with the size corresponding to the semiconductor wafer to which the film is stuck, the film is cut to the depth of at most ⅔ of the thickness of the separator from the dicing tape side. As a result, in the film for semiconductor device production to be produced, the separator is so processed as to have a cut formed along the outer periphery of the dicing tape, and the depth of the cut is at most ⅔ of the thickness of the separator. Accordingly, in the film for semiconductor device production to be produced according to the production method for producing a semiconductor device production of the invention, the adhesive layer-attached dicing tape can be readily peeled from the separator starting from the cut. In addition, since the depth of the cut is at most ⅔ of the thickness of the separator, the separator is prevented from being torn from the cut part (cut) when the adhesive layer-attached dicing tape is peeled from the separator. As a result, the adhesive layer-attached dicing tape can be favorably peeled (picked up) from the separator.

The present invention also provides a method for producing a semiconductor device by using the above-mentioned film for semiconductor device production, the method comprising: peeling the separator from the film for semiconductor device production, and attaching a semiconductor wafer onto the adhesive layer.

The semiconductor device production method of the invention uses the above-mentioned film for semiconductor device production, in which the depth of the cut formed in the separator is at most ⅔ of the thickness of the separator. Accordingly, the separator is prevented from being torn from the cut part (cut) when the adhesive layer-attached dicing tape is peeled from the separator, and a semiconductor wafer can be favorably stuck onto the adhesive layer.

The present invention also provides a film for semiconductor device production, which comprises: a separator; and a plurality of dicing tapes laminated on a separator at a predetermined interval, wherein the separator is processed to have a cut formed along the outer periphery of the dicing tape, and the depth of the cut is at most ⅔ of the thickness of the separator.

In the above-mentioned constitution, the separator is so processed as to have a cut formed along the outer periphery of the dicing tape. Accordingly, starting from the cut, the dicing tape can be readily peeled from the separator. In addition, since the depth of the cut is at most ⅔ of the thickness of the separator, the separator is prevented from being torn from the cut part (cut) when the dicing tape is peeled from the separator. As a result, the dicing tape can be favorably peeled (picked up) from the separator.

The present invention also provides a method for producing the film for semiconductor device production, the method comprising: preparing a separator-attached film that comprises a separator and a plurality of dicing tapes laminated on the separator, and cutting the separator-attached film in accordance with the size corresponding to the semiconductor wafer to which the film is stuck, in which the film is cut to the depth of at most ⅔ of the thickness of the separator from the dicing tape side.

In the above constitution, when the separator-attached film is cut in accordance with the size corresponding to the semiconductor wafer to which the film is stuck, the film is cut to the depth of at most ⅔ of the thickness of the separator from the side of the dicing tape. As a result, in the film for semiconductor device production to be produced, the separator is so processed as to have a cut formed along the outer periphery of the dicing tape, and the depth of the cut is at most ⅔ of the thickness of the separator. Accordingly, in the film for semiconductor device production to be produced according to the production method for producing a film for semiconductor device production of the invention, the dicing tape can be readily peeled from the separator, starting from the cut. In addition, since the depth of the cut is at most ⅔ of the thickness of the separator, the separator is prevented from being torn from the cut part (cut) when the dicing tape is peeled from the separator. As a result, the dicing tape can be favorably peeled (picked up) from the separator.

The present invention also provides a method for producing a semiconductor device by using the above-mentioned film for semiconductor device production, the method comprising: peeling the separator from the film for semiconductor device production, and attaching a semiconductor wafer onto the dicing tape.

The method for producing a semiconductor device of the invention uses the above-mentioned film for semiconductor device production, in which, therefore, the depth of the cut formed in the separator is at most ⅔ of the thickness of the separator. Accordingly, the separator is prevented from being torn from the cut part (cut) when the dicing tape is peeled from the separator, and a semiconductor wafer can be favorably stuck onto the adhesive layer.

DESCRIPTION OF REFERENCE NUMERALS AND SIGNS

1 Adhesive layer-Attached Dicing Tape
2 Adhesive layer
3 Dicing Tape
31 Base Material
32 Pressure-sensitive adhesive Layer
40 Film for Semiconductor Device Production
42 Separator
44 Cut
4 Semiconductor Wafer
5 Semiconductor Chip
51 Bump Formed on the Circuit Face Side of Semiconductor Chip 5
6 Adherend
61 Conductive Material for Conjunction Attached to Connection Pad of Adherend 6

BEST MODE FOR CARRYING OUT THE INVENTION

Figure 1A:
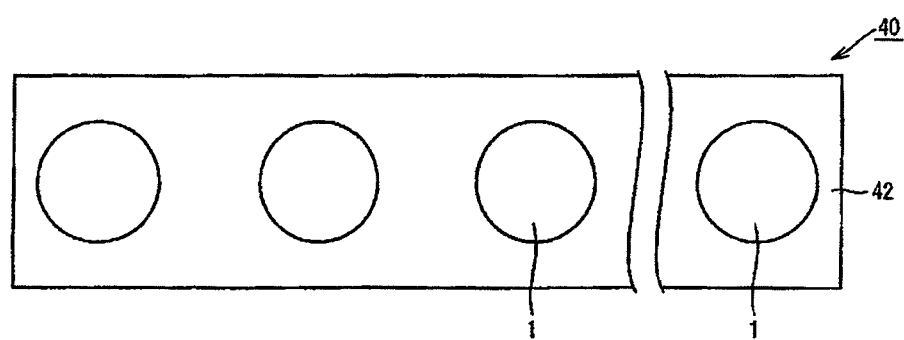
FIG. 1A is a schematic cross-sectional view showing one example of the film for semiconductor device production of the invention.
Figure 1B:
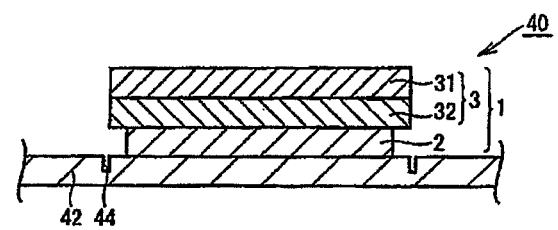
FIG. 1B is a partial plan view thereof.

One embodiment of the invention is described with reference to FIGS. 1A and 1B, to which, however, the invention should not be limited. FIG. 1A is a schematic cross-sectional view showing one example of the film for semiconductor device production of this embodiment; and FIG. 1B is a partial plan view thereof. In the drawings attached to the present specification, parts unnecessary for explanation are omitted, and for facilitating the description thereof, some parts are enlarged or reduced.

(Film for Semiconductor Device Production)

As shown in FIG. 1A and FIG. 1B, the film 40 for semiconductor device production is so designed that adhesive layer-attached dicing tapes 1 that are circular on the plan view thereof are laminated on a long separator 42 at predetermined intervals.

(Adhesive Layer-Attached Dicing Tape)

The adhesive layer-attached dicing tape 1 comprises a dicing tape 3 comprising a base material 31 and a pressure-sensitive adhesive layer 32 provided on the base material 31, and an adhesive layer 2 provided on the pressure-sensitive adhesive layer 32. The diameter of the adhesive layer 2 is the same as the diameter of the dicing tape 3, or is, as shown in FIG. 1B, preferably smaller than the diameter of the dicing tape 3. The adhesive layer-attached dicing tape 1 is laminated on the separator 42 via the adhesive layer 2 serving as the attaching face therebetween. The separator 42 is so processed as to have a cut 44 having a depth of at most ⅔ of the thickness of the separator 42, along the outer periphery of the dicing tape 3 from the side of the dicing tape 3. The depth of the cut 44 is preferably from ⅙ to ⅔, more preferably from ⅓ to ⅔ of the thickness of the separator 42. The separator 42 is so processed as to have the cut 44 along the outer periphery of the dicing tape 3, therefore facilitating the peeling of the adhesive layer-attached dicing tape 1 from the separator 42, starting from the cut 44. Since the depth of the cut 44 is at most ⅔ of the thickness of the separator 42, the separator 42 is prevented from being torn from the cut part (cut) when the adhesive layer-attached dicing tape 1 is peeled from the separator 42. As a result, the adhesive layer-attached dicing tape 1 can be favorably peeled (picked up) from the separator 42.

(Separator)

As the separator 42, usable are suitable thin sheets of, for example, paper and other paper-based base materials; fabric, nonwoven fabric, felt, net and other fibrous base materials; metal foil, metal plate and other metallic base materials; plastic base materials such as plastic films or sheets; rubber-based base materials such as rubber sheets; foams such as foam sheets, and their laminates [especially laminates of plastic base materials and other base materials, laminates of plastic films (or sheets)]. As the base material in the invention, preferred are plastic base materials such as plastic films or sheets. The plastic materials include, for example, olefinic resins such as polyethylene (PE), polypropylene (PP), and ethylene-propylene copolymers; copolymers using ethylene as the monomer component, such as ethylene-vinyl acetate copolymers (EVA), ionomer resins, ethylene-(meth)acrylic acid copolymers, and ethylene-(meth)acrylate (random, alternating) copolymers; polyesters such as polyethylene terephthalate (PET), polyethylene naphthalate (PEN), and polybutylene terephthalate (PBT); acrylic resins; polyvinyl chloride (PVC); polyurethanes; polycarbonates; polyphenylene sulfide (PPS); amide-based resins such as polyamides (Nylon) and whole aromatic polyamides (aramide); polyether ether ketones (PEEK); polyimides; polyetherimides; polyvinylidene chloride; ABS (acrylonitrile-butadiene-styrene copolymers); cellulose-based resins; silicone resins; and fluorinated resins. The separator 42 may be a single layer or a multilayer formed of two or more layers. The separator 42 may be produced according to known methods.

Preferably, the separator 42 is subjected to releasing treatment at least on the surface thereof on which the adhesive layer 2 is laminated.

Examples of the releasing agent for the releasing treatment includes fluorine-based releasing agents, long chain alkyl acrylate-based releasing agents, silicone-based releasing agents. Above all, preferred are silicone-based releasing agents.

Not specifically defined, the thickness of the separator 42 is preferably from 3 to 300 μm, more preferably from 5 to 200 even more preferably from 10 to 100 μm. When the thickness of the separator 42 is at least 10 μm, the separator 42 can be readily processed to have a cut having a depth of at most ⅔ of the thickness of the separator 42.

(Adhesive Layer)

The adhesive layer 2 has a film shape. The adhesive layer 2 is usually in an uncured state (including a semi-cured state) in the embodiment of the adhesive layer-attached dicing tape 1 or the film 40 for semiconductor device production as a product, and is thermally cured after the adhesive layer-attached dicing tape 1 is attached to a semiconductor wafer.

Preferably, the adhesive layer is formed of at least a thermosetting resin, more preferably formed of at least a thermosetting resin and a thermoplastic resin. When the adhesive layer is formed of at least a thermosetting resin, the adhesive layer can effectively exhibit the sticking function thereof.

Examples of the thermoplastic resin include natural rubber, butyl rubber, isoprene rubber, chloroprene rubber, an ethylene-vinyl acetate copolymer, an ethylene-acrylic acid copolymer, an ethylene-acrylic acid ester copolymer, a polybutadiene resin, a polycarbonate resin, a thermoplastic polyimide resin, a polyamide resin such as 6-nylon and 6,6-nylon, a phenoxy resin, an acrylic resin, a saturated polyester resin such as PET (polyethylene terephthalate) or PBT (polybutylene terephthalate), a polyamideimide resin, or a fluorine resin. The thermoplastic resin may be employed singly or in a combination of two or more kinds. Among these thermoplastic resins, an acrylic resin containing a small amount of ionic impurities, having high heat resistance and capable of securing reliability of a semiconductor element is especially preferable.

The acrylic resins are not particularly restricted, and examples thereof include polymers containing one kind or two or more kinds of esters of acrylic acid or methacrylic acid having a straight chain or branched alkyl group having 30 or less carbon atoms, preferably 4 to 18 carbon atoms, more preferably 6 to 10 carbon atoms, and especially 8 or 9 carbon atoms as component(s). Namely, in the invention, the acrylic resin has a broad meaning also including a methacrylic resin. Examples of the alkyl group include a methyl group, an ethyl group, a propyl group, an isopropyl group, an n-butyl group, a t-butyl group, an isobutyl group, a pentyl group, an isopentyl group, a hexyl group, a heptyl group, a 2-ethylhexyl group, an octyl group, an isooctyl group, a nonyl group, an isononyl group, a decyl group, an isodecyl group, an undecyl group, a dodecyl group (lauryl group), a tridecyl group, a tetradecyl group, a stearyl group, and an octadecyl group.

Moreover, other monomers for forming the acrylic resins (monomers other than the alkyl esters of acrylic acid or methacrylic acid in which the alkyl group is one having 30 or less carbon atoms) are not particularly restricted, and examples thereof include carboxyl group-containing monomers such as acrylic acid, methacrylic acid, carboxylethyl acrylate, carboxylpentyl acrylate, itaconic acid, maleic acid, fumaric acid, and crotonic acid; acid anhydride monomers such as maleic anhydride and itaconic anhydride; hydroxyl group-containing monomers such as 2-hydroxyethyl (meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 10-hydroxydecyl (meth)acrylate, 12-hydroxylauryl (meth)acrylate, and (4-hydroxymethylcyclohexyl)-methylacrylate; sulfonic acid group-containing monomers such as styrenesulfonic acid, allylsulfonic acid, 2-(meth)acrylamido-2-methylpropanesulfonic acid, (meth)acrylamidopropanesulfonic acid, sulfopropyl(meth)acrylate, and (meth)acryloyloxynaphthalenesulfonic acid; and phosphoric acid group-containing monomers such as 2-hydroxyethylacryloyl phosphate. In this regard, the (meth)acrylic acid means acrylic acid and/or methacrylic acid,(meth)acrylate means acrylate and/or methacrylate, (meth)acryl means acryl and/or methacryl, etc., which shall be applied over the whole specification.

Moreover, examples of the thermosetting resin include, in addition to an epoxy resin and a phenol resin, an amino resin, an unsaturated polyester resin, a polyurethane resin, a silicone resin and a thermosetting polyimide resin. The thermosetting resin may be employed singly or in a combination of two or more kinds. As the thermosetting resin, an epoxy resin containing only a small amount of ionic impurities which corrode a semiconductor element is suitable. Also, the phenol resin is suitably used as a curing agent of the epoxy resins.

The epoxy resin is not particularly restricted and, for example, a difunctional epoxy resin or a polyfunctional epoxy resin such as a bisphenol A type epoxy resin, a bisphenol F type epoxy resin, a bisphenol S type epoxy resin, a brominated bisphenol A type epoxy resin, a hydrogenated bisphenol A type epoxy resin, a bisphenol AF type epoxy resin, a biphenyl type epoxy resin, a naphthalene type epoxy resin, a fluorene type epoxy resin, a phenol novolak type epoxy resin, an o-cresol novolak type epoxy resin, a trishydroxyphenylmethane type epoxy resin and a tetraphenylolethane type epoxy resin, or an epoxy resin such as a hydantoin type epoxy resin, a trisglycidylisocyanurate type epoxy resin or a glycidylamine type epoxy resin may be used.

As the epoxy resin, among those exemplified above, a novolak type epoxy resin, a biphenyl type epoxy resin, a trishydroxyphenylmethane type epoxy resin, and a tetraphenylolethane type epoxy resin are preferable. This is because these epoxy resins have high reactivity with a phenol resin as a curing agent and are superior in heat resistance and the like.

Furthermore, the above-mentioned phenol resin acts as a curing agent of the epoxy resin, and examples thereof include novolak type phenol resins such as phenol novolak resins, phenol aralkyl resins, cresol novolak resins, tert-butylphenol novolak resins, and nonylphenol novolak resins; resol type phenol resins; and polyoxystyrenes such as poly-p-oxystyrene. The phenol resin may be employed singly or in a combination of two or more kinds. Among these phenol resins, phenol novolak resins and phenol aralkyl resins are especially preferable. This is because connection reliability of the semiconductor device can be improved.

The mixing ratio of the epoxy resin to the phenol resin is preferably made, for example, such that the hydroxyl group in the phenol resin becomes 0.5 to 2.0 equivalents per equivalent of the epoxy group in the epoxy resin component. It is more preferably 0.8 to 1.2 equivalents. That is, when the mixing ratio becomes outside the range, a curing reaction does not proceed sufficiently, and the characteristics of the epoxy resin cured product tends to deteriorate.

The content of the thermosetting resin is preferably from 5% by weight to 90% by weight of all the resin components in the adhesive layer, more preferably from 10% by weight to 85% by weight, even more preferably from 15% by weight to 80% by weight. When the content is 5% by weight or more, then the thermosetting shrinkage may be readily controlled to be 2% by volume or more. In addition, in thermally curing the encapsulating resin, the adhesive layer may be fully thermocured so as to be surely adhered and fixed to the back surface of a semiconductor element to give a flip chip type semiconductor device with no peeling failure. On the other hand, when the content is 90% by weight or less, then the package (PKG, flip chip type semiconductor device) may be prevented from warping.

Not specifically defined, the thermal curing-accelerating catalyst for epoxy resins and phenolic resins may be suitably selected from known thermal curing-accelerating catalysts. One or more thermal curing-accelerating catalysts may be used here either singly or as combined. As the thermal curing-accelerating catalyst, for example, an amine-based curing-accelerating catalyst, a phosphorus-based curing-accelerating catalyst, an imidazole-based curing-accelerating catalyst, a boron-based curing-accelerating catalyst, or a phosphorus-boron-based curing-accelerating catalyst can be used.

The adhesive layer is particularly suitably formed of a resin composition containing an epoxy resin and a phenolic resin or a resin composition containing an epoxy resin, a phenolic resin, and an acrylic resin. Since these resins contain only a small amount of ionic impurities and have high heat resistance, reliability of semiconductor elements can be secured.

It is important that the adhesive layer has adhesiveness (close adhesiveness) to the back surface (non-circuit-formed face) of semiconductor wafer. The adhesive layer can be, for example, formed of a resin composition containing an epoxy resin as a thermosetting resin component. In case where the adhesive layer is cured beforehand to some degree, at its preparation, it is preferable to add a polyfunctional compound capable of reacting with the functional group or the like at the molecular chain end of the polymer as a crosslinking agent. Thereby, adhesive characteristics under high temperature can be enhanced and improvement of the heat resistance of the film can be achieved.

The adhesive force of the adhesive layer to semiconductor wafer (23° C., peeling angle of 180 degrees, peeling rate of 300 mm/min) is preferably within a range of from 0.5 N/20 mm to 15 N/20 mm, more preferably from 0.7 N/20 mm to 10 N/20 mm. When the adhesive force is at least 0.5 N/20 mm, then the adhesive layer can be adhered to semiconductor wafer and semiconductor element with excellent adhesiveness and is free from film swelling or the like adhesion failure. In addition, in dicing of semiconductor wafer, the chips can be prevented from flying out. On the other hand, when the adhesive force is at most 15 N/20 mm, then it facilitates peeling from the dicing tape.

The crosslinking agent is not particularly restricted and known crosslinking agents can be used. Specifically, for example, not only isocyanate-based crosslinking agents, epoxy-based crosslinking agents, melamine-based crosslinking agents, and peroxide-based crosslinking agents but also urea-based crosslinking agents, metal alkoxide-based crosslinking agents, metal chelate-based crosslinking agents, metal salt-based crosslinking agents, carbodiimide-based crosslinking agents, oxazoline-based crosslinking agents, aziridine-based crosslinking agents, amine-based crosslinking agents, and the like may be mentioned. As the crosslinking agent, an isocyanate-based crosslinking agent or an epoxy-based crosslinking agent is suitable. The crosslinking agent may be employed singly or in a combination of two or more kinds.

Examples of the isocyanate-based crosslinking agents include lower aliphatic polyisocyanates such as 1,2-ethylene diisocyanate, 1,4-butylene diisocyanate, and 1,6-hexamethylene diisocyanate; alicyclic polyisocyanates such as cyclopentylene diisocyanate, cyclohexylene diisocyanate, isophorone diisocyanate, hydrogenated tolylene diisocyanate, and hydrogenated xylylene diisocyanate; and aromatic polyisocyanates such as 2,4-tolylene diisocyanate, 2,6-tolylene diisocyanate, 4,4'-diphenylmethane diisocyanate, and xylylene diisocyanate. In addition, a trimethylolpropane/tolylene diisocyanate trimer adduct [a trade name "COLONATE L" manufactured by Nippon Polyurethane Industry Co., Ltd.], a trimethylolpropane/hexamethylene diisocyanate trimer adduct [a trade name "COLONATE HL" manufactured by Nippon Polyurethane Industry Co., Ltd.], and the like are also used. Moreover, examples of the epoxy-based crosslinking agents include N,N,N',N'-tetraglycidyl-m-xylenediamine, diglycidylaniline, 1,3-bis(N,N-glycidylaminomethyl)cyclohexane, 1,6-hexanediol diglycidyl ether, neopentyl glycol diglycidyl ether, ethylene glycol diglycidyl ether, propylene glycol diglycidyl ether, polyethylene glycol diglycidyl ether, polypropylene glycol diglycidyl ether, sorbitol polyglycidyl ether, glycerol polyglycidyl ether, pentaerythritol polyglycidyl ether, polyglycerol polyglycidyl ether, sorbitan polyglycidyl ether, trimethylolpropnane polyglycidyl ether, adipic acid diglycidyl ester, o-phthalic acid diglycidyl ester, triglycidyl-tris(2-hydroxyethyl) isocyanurate, resorcin diglycidyl ether, and bisphenol-S-diglycidyl ether, and also epoxy-based resins having two or more epoxy groups in the molecule.

The amount of the crosslinking agent to be used is not particularly restricted and can be appropriately selected depending on the degree of the crosslinking. Specifically, it is preferable that the amount of the crosslinking agent to be used is usually 7 parts by weight or less (for example, 0.05 to 7 parts by weight) based on 100 parts by weight of the polymer component (particularly, a polymer having a functional group at the molecular chain end). When the amount of the crosslinking agent is larger than 7 parts by weight based on 100 parts by weight of the polymer component, the adhesive force is lowered, so that the case is not preferred. From the viewpoint of improving the cohesive force, the amount of the crosslinking agent is preferably 0.05 parts by weight or more based on 100 parts by weight of the polymer component.

In the invention, instead of the use of the crosslinking agent or together with the use of the crosslinking agent, it is also possible to perform a crosslinking treatment by irradiation with an electron beam, UV light, or the like.

The adhesive layer is preferably colored. Thereby, an excellent laser marking property and an excellent appearance property can be exhibited, and it becomes possible to make a semiconductor device having a value-added appearance property. As above, since the colored adhesive layer has an excellent marking property, marking can be performed to impart various kinds of information such as literal information and graphical information to the face on the non-circuit side of the semiconductor element or a semiconductor device using the semiconductor element by utilizing any of various marking methods such as a printing method and a laser marking method through the adhesive layer. Particularly, by controlling the color of coloring, it becomes possible to observe the information (for example, literal information and graphical information) imparted by marking with excellent visibility. Moreover, when the adhesive layer is colored, the dicing tape and the adhesive layer can be easily distinguished from each other, so that workability and the like can be enhanced. Furthermore, for example, as a semiconductor device, it is possible to classify products thereof by using different colors. In the case where the adhesive layer is colored (the case where the adhesive layer is neither colorless nor transparent), the color shown by coloring is not particularly limited but, for example, is preferably dark color such as black, blue or red color, and black color is especially suitable.

In the present embodiment, dark color basically means a dark color having $L^*$, defined in $L^*a^*b^*$ color space, of 60 or smaller (0 to 60), preferably 50 or smaller (0 to 50), and more preferably 40 or smaller (0 to 40).

Moreover, black color basically means a black-based color having $L^*$, defined in $L^*a^*b^*$ color space, of 35 or smaller (0 to 35), preferably 30 or smaller (0 to 30), and more preferably 25 or smaller (0 to 25). In this regard, in the black color, each of $a^*$ and $b^*$, defined in the $L^*a^*b^*$ color space, can be suitably selected according to the value of $L^*$. For example, both of $a^*$ and $b^*$ are within the range of preferably −10 to 10, more preferably −5 to 5, and further preferably −3 to 3 (particularly 0 or about 0).

In the present embodiment, $L^*$, $a^*$, and $b^*$ defined in the $L^*a^*b^*$ color space can be determined by a measurement with a color difference meter (a trade name "CR-200" manufactured by Minolta Ltd; color difference meter). The $L^*a^*b^*$ color space is a color space recommended by the Commission Internationale de l'Eclairage (CIE) in 1976, and means a color space called CIE1976($L^*a^*b^*$) color space. Also, the $L^*a^*b^*$ color space is defined in Japanese Industrial Standards in JIS Z8729.

At coloring of the adhesive layer, according to an objective color, a colorant (coloring agent) can be used. As such a colorant, various dark-colored colorants such as black-colored colorants, blue-colored colorants, and red-colored colorants can be suitably used and black-colored colorants are more suitable. The colorant may be any of pigments and dyes. The colorant may be employed singly or in combination of two or more kinds. In this regard, as the dyes, it is possible to use any forms of dyes such as acid dyes, reactive dyes, direct dyes, disperse dyes, and cationic dyes. Moreover, also with regard to the pigments, the form thereof is not particularly restricted and can be suitably selected and used among known pigments.

In particular, when a dye is used as a colorant, the dye becomes in a state that it is homogeneously or almost homogeneously dispersed by dissolution in the adhesive layer, so that the adhesive layer (as a result, the adhesive layer-attached dicing tape) having a homogeneous or almost homogeneous color density can be easily produced. Accordingly, when a dye is used as a colorant, the adhesive layer in the adhesive layer-attached dicing tape can have a homogeneous or almost homogeneous color density and can enhance a marking property and an appearance property.

The black-colored colorant is not particularly restricted and can be, for example, suitably selected from inorganic black-colored pigments and black-colored dyes. Moreover, the black-colored colorant may be a colorant mixture in which a cyan-colored colorant (blue-green colorant), a magenta-colored colorant (red-purple colorant), and a yellow-colored colorant (yellow colorant) are mixed. The black-colored colorant may be employed singly or in a combination of two or more kinds. Of course, the black-colored colorant may be used in combination with a colorant of a color other than black.

Specific examples of the black-colored colorant include carbon black (such as furnace black, channel black, acetylene black, thermal black, or lamp black), graphite, copper oxide, manganese dioxide, azo-type pigments (such as azomethine azo black), aniline black, perylene black, titanium black, cyanine black, active charcoal, ferrite (such as non-magnetic ferrite or magnetic ferrite), magnetite, chromium oxide, iron oxide, molybdenum disulfide, a chromium complex, a composite oxide type black pigment, and an anthraquinone type organic black pigment.

In the invention, as the black-colored colorant, black-colored dyes such as C.I. Solvent Black 3, 7, 22, 27, 29, 34, 43, 70, C.I. Direct Black 17, 19, 22, 32, 38, 51, 71, C.I. Acid Black 1, 2, 24, 26, 31, 48, 52, 107, 109, 110, 119, 154, and C.I. Disperse Black 1, 3, 10, 24; black-colored pigments such as C.I. Pigment Black 1, 7; and the like can also be utilized.

As such black-colored colorants, for example, a trade name "Oil Black BY", a trade name "Oil Black BS", a trade name "Oil Black HBB", a trade name "Oil Black 803", a trade name "Oil Black 860", a trade name "Oil Black 5970", a trade name "Oil Black 5906", a trade name "Oil Black 5905" (manufactured by Orient Chemical Industries Co., Ltd.), and the like are commercially available.

Examples of colorants other than the black-colored colorant include cyan-colored colorants, magenta-colored colorants, and yellow-colored colorants. Examples of the cyan-colored colorants include cyan-colored dyes such as C.I. Solvent Blue 25, 36, 60, 70, 93, 95; C.I. Acid Blue 6 and 45; cyan-colored pigments such as C.I. Pigment Blue 1, 2, 3, 15, 15:1, 15:2, 15:3, 15:4, 15:5, 15:6, 16, 17, 17:1, 18, 22, 25, 56, 60, 63, 65, 66; C.I. Vat Blue 4, 60; and C.I. Pigment Green 7.

Moreover, among the magenta colorants, examples of magenta-colored dye include C.I. Solvent Red 1, 3, 8, 23, 24, 25, 27, 30, 49, 52, 58, 63, 81, 82, 83, 84, 100, 109, 111, 121, 122; C.I. Disperse Red 9; C.I. Solvent Violet 8, 13, 14, 21, 27; C.I. Disperse Violet 1; C.I. Basic Red 1, 2, 9, 12, 13, 14, 15, 17, 18, 22, 23, 24, 27, 29, 32, 34, 35, 36, 37, 38, 39, 40; C.I. Basic Violet 1, 3, 7, 10, 14, 15, 21, 25, 26, 27 and 28.

Among the magenta-colored colorants, examples of magenta-colored pigment include C.I. Pigment Red 1, 2, 3, 4, 5, 6, 7, 8, 9, 10, 11, 12, 13, 14, 15, 16, 17, 18, 19, 21, 22, 23, 30, 31, 32, 37, 38, 39, 40, 41, 42, 48:1, 48:2, 48:3, 48:4, 49, 49:1, 50, 51, 52, 52:2, 53:1, 54, 55, 56, 57:1, 58, 60, 60:1, 63, 63:1, 63:2, 64, 64:1, 67, 68, 81, 83, 87, 88, 89, 90, 92, 101, 104, 105, 106, 108, 112, 114, 122, 123, 139, 144, 146, 147, 149, 150, 151, 163, 166, 168, 170, 171, 172, 175, 176, 177, 178, 179, 184, 185, 187, 190, 193, 202, 206, 207, 209, 219, 222, 224, 238, 245; C.I. Pigment Violet 3, 9, 19, 23, 31, 32, 33, 36, 38, 43, 50; C.I. Vat Red 1, 2, 10, 13, 15, 23, 29 and 35.

Moreover, examples of the yellow-colored colorants include yellow-colored dyes such as C.I. Solvent Yellow 19, 44, 77, 79, 81, 82, 93, 98, 103, 104, 112, and 162; yellow-colored pigments such as C.I. Pigment Orange 31, 43; C.I. Pigment Yellow 1, 2, 3, 4, 5, 6, 7, 10, 11, 12, 13, 14, 15, 16, 17, 23, 24, 34, 35, 37, 42, 53, 55, 65, 73, 74, 75, 81, 83, 93, 94, 95, 97, 98, 100, 101, 104, 108, 109, 110, 113, 114, 116, 117, 120, 128, 129, 133, 138, 139, 147, 150, 151, 153, 154, 155, 156, 167, 172, 173, 180, 185, 195; C.I. Vat Yellow 1, 3, and 20.

Various colorants such as cyan-colored colorants, magenta-colored colorants, and yellow-colorant colorants may be employed singly or in a combination of two or more kinds, respectively. In this regard, in the case where two or more kinds of various colorants such as cyan-colored colorants, magenta-colored colorants, and yellow-colorant colorants are used, the mixing ratio (or blending ratio) of these colorants is not particularly restricted and can be suitably selected according to the kind of each colorant, an objective color, and the like.

In the case where the adhesive layer 2 is colored, the colored form is not particularly restricted. The adhesive layer may be, for example, a single-layer film-shaped article added with a coloring agent. Moreover, the film may be a laminated film where a resin layer formed of at least a thermosetting resin and a coloring agent layer are at least laminated. In this regard, in the case where the adhesive layer 2 is a laminated film of the resin layer and the coloring agent layer, the adhesive layer 2 in the laminated form preferably has a laminated form of a resin layer/a coloring agent layer/a resin layer. In this case, two resin layers at both sides of the coloring agent layer may be resin layers having the same composition or may be resin layers having different composition.

Into the adhesive layer 2, other additives can be suitably blended according to the necessity. Examples of the other additives include an extender, an antiaging agent, an antioxidant, and a surfactant, in addition to a filler, a flame retardant, a silane-coupling agent, and an ion-trapping agent.

The filler may be any of an inorganic filler and an organic filler but an inorganic filler is suitable. By blending a filler such as an inorganic filler, imparting of electric conductivity to the adhesive layer, improvement of the thermal conductivity, control of elastic modulus, and the like can be achieved. In this regard, the adhesive layer 2 may be electrically conductive or non-conductive. Examples of the inorganic filler include various inorganic powders composed of silica, clay, gypsum, calcium carbonate, barium sulfate, alumina oxide, beryllium oxide, ceramics such as silicone carbide and silicone nitride, metals or alloys such as aluminum, copper, silver, gold, nickel, chromium, lead, tin, zinc, palladium, and solder, carbon, and the like. The filler may be employed singly or in a combination of two or more kinds. Particularly, the filler is suitably silica and more suitably fused silica. The average particle diameter of the inorganic filler is preferably within the range of 0.1 µm to 80 µm. The average particle diameter of the inorganic filler can be measured by a laser diffraction-type particle size distribution measurement apparatus.

The blending amount of the filler (in particular, inorganic filler) is preferably 80 parts by weight or less (0 part by weight to 80 parts by weight) and more preferably 0 part by weight to 70 parts by weight based on 100 parts by weight of the organic resin components.

Examples of the flame retardant include antimony trioxide, antimony pentoxide, and brominated epoxy resins. The flame retardant may be employed singly or in a combination of two or more kinds. Examples of the silane coupling agent include β-(3,4-epoxycyclohexyl)ethyltrimethoxysilane, γ-glycidoxypropyltrimethoxysilane, and γ-glycidoxypropylmethyldiethoxysilane. The silane coupling agent may be employed singly or in a combination of two or more kinds. Examples of the ion-trapping agent include hydrotalcites and bismuth hydroxide. The ion-trapping agent may be employed singly or in a combination of two or more kinds.

The adhesive layer 2 can be, for example, formed by utilizing a commonly used method including mixing a thermosetting resin such as an epoxy resin and, if necessary, a thermoplastic resin such as an acrylic resin and optional solvent and other additives to prepare a resin composition, followed by forming it to a film-shaped layer.

Specifically, a film-shaped layer (adhesive layer) as the adhesive layer can be formed, for example, by a method including applying the resin composition on the pressure-sensitive adhesive layer 32 of the dicing tape; a method including applying the resin composition on an appropriate separator (such as release paper) to form a resin layer (or an adhesive layer) and then transferring (transcribing) it on the pressure-sensitive adhesive layer 32; or the like. In this regard, the resin composition may be a solution or a dispersion.

Incidentally, in the case where the adhesive layer 2 is formed of a resin composition containing a thermosetting resin such as an epoxy resin, the adhesive layer is in a state that the thermosetting resin is uncured or partially cured at a stage before the film is applied to a semiconductor wafer. In this case, after it is applied to the semiconductor wafer (specifically, usually, at the time when the encapsulating material is cured in the flip chip bonding step), the thermosetting resin in the adhesive layer is completely or almost completely cured.

As above, since the adhesive layer is in a state that the thermosetting resin is uncured or partially cured even when the film contains the thermosetting resin, the gel fraction of the adhesive layer is not particularly restricted but is, for example, suitably selected from the range of 50% by weight or less (0 to 50% by weight) and is preferably 30% by weight or less (0 to 30% by weight) and particularly preferably 10% by weight or less (0 to 10% by weight). The gel fraction of the adhesive layer can be measured by the following measuring method.

<Gel Fraction Measuring Method>

About 0.1 g of a sample is sampled from the adhesive layer and precisely weighed (weight of sample) and, after the sample is wrapped in a mesh-type sheet, it is immersed in about 50 mL of toluene at room temperature for 1 week. Thereafter, a solvent-insoluble matter (content in the mesh-type sheet) is taken out of the toluene and dried at 130° C. for about 2 hours, the solvent-insoluble matter after drying is weighed (weight after immersion and drying), and a gel fraction (% by weight) is then calculated according to the following expression (a).

Gel fraction(% by weight)=[(Weight after immersion and Drying)/(Weight of sample)]×100    (a)

The gel fraction of the adhesive layer can be controlled by the kind and content of the resin components and the kind and content of the crosslinking agent and besides, heating temperature, heating time and the like.

In the invention, in the case where the adhesive layer is a film-shaped article formed of a resin composition containing a thermosetting resin such as an epoxy resin, close adhesiveness to a semiconductor wafer can be effectively exhibited.

Incidentally, since cutting water is used in the dicing step of the semiconductor wafer, the adhesive layer absorbs moisture to have a moisture content of a normal state or more in some cases. When flip chip bonding is performed with still maintaining such a high moisture content, water vapor remains at the adhesion interface between the adhesive layer and the semiconductor wafer or its processed body (semiconductor) and lifting is generated in some cases. Therefore, by constituting the adhesive layer as a configuration in which a core material having a high moisture permeability is provided on each surface thereof, water vapor diffuses and thus it becomes possible to avoid such a problem. From such a viewpoint, a multilayered structure in which the adhesive layer is formed at one surface or both surfaces of the core material may be used as the adhesive layer. Examples of the core material include films (e.g., polyimide films, polyester films, polyethylene terephthalate films, polyethylene naphthalate films, polycarbonate films, etc.), resin substrates reinforced with a glass fiber or a plastic nonwoven fiber, silicon substrates, and glass substrates.

The thickness (total thickness in the case of the laminated film) of the adhesive layer 2 is not particularly restricted but can be, for example, suitably selected from the range of about 2 µm to 200 µm. Furthermore, the thickness is preferably about 4 µm to 160 µm, more preferably about 6 µm to 100 µm, and particularly about 10 µm to 80 µm.

The tensile storage elastic modulus of the adhesive layer 2 in an uncured state at 23° C. is preferably 1 GPa or more (e.g., 1 GPa to 50 GPa), more preferably 2 GPa or more, and particularly, 3 GPa or more is suitable. When the tensile storage elastic modulus is 1 GPa or more, the attachment of the adhesive layer to a support can be effectively suppressed or prevented at the time when the adhesive layer 2 is placed on the support and transportation and the like are performed after the semiconductor chip is peeled from the pressure-sensitive adhesive layer 32 of the dicing tape together with the adhesive layer 2. In this regard, the support is, for example, a top tape, a bottom tape, and the like in a carrier tape. In the case where the adhesive layer 2 is formed of a resin composition containing a thermosetting resin, as mentioned above, the thermosetting resin is usually in a uncured or partially cured state, so that the tensile storage elastic modulus of the adhesive layer at 23° C. is a tensile storage elastic modulus at 23° C. in a state that the thermosetting resin is uncured or partially cured.

Here, the adhesive layer 2 may be either a single layer or a laminated film where a plurality of layers are laminated. In the case of the laminated film, the tensile storage elastic modulus is sufficiently 1 GPa or more (e.g., 1 GPa to 50 GPa) as the whole laminated film. Also the tensile storage elastic modulus (23° C.) of the adhesive layer in an uncured state can be controlled by suitably setting up the kind and content of the resin components (thermoplastic resin and/or thermosetting resin) or the kind and content of a filler such as a silica filler. In the case where the adhesive layer 2 is a laminated film where a plurality of layers are laminated (in the case where the adhesive layer has a form of the laminated layer), as the laminated layer form, for example, a laminated form composed of a wafer adhesive layer and a laser marking layer can be exemplified. Moreover, between the wafer adhesive layer and the laser marking layer, other layers (an intermediate layer, a light-shielding layer, a reinforcing layer, a colored layer, a base material layer, an electromagnetic wave-shielding layer, a heat conductive layer, a pressure-sensitive adhesive layer, etc.) may be provided. In this regard, the wafer adhesive layer is a layer which exhibits an excellent close adhesiveness (adhesive property) to a wafer and a layer which comes into contact with the back surface of a wafer. On the other hand, the laser marking layer is a layer which exhibits an excellent laser marking property and a layer which is utilized at the laser marking on the back surface of a semiconductor chip.

The tensile storage elastic modulus is determined by preparing the adhesive layer 2 in an uncured state without lamination onto the dicing tape 3 and measuring elastic modulus in a tensile mode under conditions of a sample width of 10 mm, a sample length of 22.5 mm, a sample thickness of 0.2 mm, a frequency of 1 Hz, and a temperature elevating rate of 10° C./minute under a nitrogen atmosphere at a prescribed temperature (23° C.) using a dynamic viscoelasticity measuring apparatus "Solid Analyzer RS A2" manufactured by Rheometrics Co. Ltd. and the measured elastic modulus is regarded as a value of tensile storage elastic modulus obtained.

Moreover, the light transmittance with a visible light (visible light transmittance, wavelength: 400 to 800 nm) in the adhesive layer 2 is not particularly restricted but is, for example, preferably in the range of 20% or less (0 to 20%), more preferably 10% or less (0 to 10%), and particularly preferably 5% or less (0 to 5%). When the adhesive layer 2 has a visible light transmittance of more than 20%, there is a concern that the transmission of the light may adversely influence the semiconductor element. The visible light transmittance (%) can be controlled by the kind and content of the resin components of the adhesive layer 2, the kind and content of the coloring agent (such as pigment or dye), the content of the inorganic filer, and the like.

The visible light transmittance (%) of the adhesive layer 2 can be determined as follows. Namely, a adhesive layer 2 having a thickness (average thickness) of 20 µm itself is prepared. Then, the adhesive layer 2 is irradiated with a visible light having a wavelength of 400 to 800 nm in a prescribed intensity [apparatus: a visible light generating apparatus manufactured by Shimadzu Corporation [trade name "ABSORPTION SPECTRO PHOTOMETER"], and the intensity of transmitted visible light is measured. Further, the visible light transmittance (%) can be determined based on intensity change before and after the transmittance of the visible light through the adhesive layer 2. In this regard, it is also possible to derive visible light transmittance (%; wavelength: 400 to 800 nm) of the adhesive layer 2 having a thickness of 20 µm from the value of the visible light transmittance (%; wavelength: 400 to 800 nm) of the adhesive layer 2 whose thickness is not 20 µm. In the invention, the visible light transmittance (%) is determined in the case of the adhesive layer 2 having a thickness of 20 µm, but the adhesive layer according to the invention is not limited to one having a thickness of 20 µm.

Moreover, as the adhesive layer 2, one having lower moisture absorbance is more preferred. Specifically, the moisture absorbance is preferably 1% by weight or less and more preferably 0.8% by weight or less. By regulating the moisture absorbance to 1% by weight or less, the laser marking property can be enhanced. Moreover, for example, the generation of voids between the adhesive layer 2 and the semiconductor element can be suppressed or prevented in the reflow step. The moisture absorbance is a value calculated from a weight change before and after the adhesive layer 2 is allowed to stand under an atmosphere of a temperature of 85° C. and a humidity of 85% RH for 168 hours. In the case where the adhesive layer 2 is formed of a resin composition containing a thermosetting resin, the moisture absorbance means a value obtained when the adhesive layer after thermal curing is allowed to stand under an atmosphere of a temperature of 85° C. and a humidity of 85% RH for 168 hours. Moreover, the moisture absorbance can be regulated, for example, by changing the amount of the inorganic filler to be added.

Moreover, as the adhesive layer 2, one having a smaller ratio of volatile matter is more preferred. Specifically, the ratio of weight decrease (weight decrease ratio) of the adhesive layer 2 after heating treatment is preferably 1% by weight or less and more preferably 0.8% by weight or less. The conditions for the heating treatment are a heating temperature of 250° C. and a heating time of 1 hour. By regulating the weight decrease ratio to 1% by weight or less, the laser marking property can be enhanced. Moreover, for example, the generation of cracks in a flip chip type semiconductor device can be suppressed or prevented in the reflow step. The weight decrease ratio can be regulated, for example, by adding an inorganic substance capable of reducing the crack generation at lead-free solder reflow. In the case where the adhesive layer 2 is formed of a resin composition containing a thermosetting resin component, the weight decrease ratio is a value obtained when the adhesive layer after thermal curing is heated under conditions of a temperature of 250° C. and a heating time of 1 hour.

(Dicing Tape)

The dicing tape 3 includes a base material 31 and a pressure-sensitive adhesive layer 32 formed on the base material 31. Thus, it is sufficient that the dicing tape 3 has a configuration in which the base material 31 and the pressure-sensitive adhesive layer 32 are laminated. The base material (supporting base material) can be used as a supporting material for the pressure-sensitive adhesive layer and the like. The base material 31 preferably has a radiation ray-transmitting property. As the base material 31, for example, suitable thin materials, e.g., paper-based base materials such as paper; fiber-based base materials such as fabrics, non-woven fabrics, felts, and nets; metal-based base materials such as metal foils and metal plates; plastic base materials such as plastic films and sheets; rubber-based base materials such as rubber sheets; foamed bodies such as foamed sheets; and laminates thereof [particularly, laminates of plastic based materials with other base materials, laminates of plastic films (or sheets) each other, etc.] can be used. In the invention, as the base material, plastic base materials such as plastic films and sheets can be suitably employed. Examples of raw materials for such plastic materials include olefinic resins such as polyethylene (PE), polypropylene (PP), and ethylene-propylene copolymers; copolymers using ethylene as a monomer component, such as ethylene-vinyl acetate copolymers (EVA), ionomer resins, ethylene-(meth)acrylic acid copolymers, and ethylene-(meth)acrylic acid ester (random, alternating) copolymers; polyesters such as polyethylene terephthalate (PET), polyethylene naphthalate (PEN), and polybutylene terephthalate (PBT); acrylic resins; polyvinyl chloride (PVC); polyurethanes; polycarbonates; polyphenylene sulfide (PPS); amide-based resins such as polyamides (Nylon) and whole aromatic polyamides (aramide); polyether ether ketones (PEEK); polyimides; polyetherimides; polyvinylidene chloride; ABS (acrylonitrile-butadiene-styrene copolymers); cellulose-based resins; silicone resins; and fluorinated resins.

In addition, the materials for the base material 31 include polymers such as crosslinked materials of the foregoing resins. The plastic films may be used without stretching or may be used after subjected to a uniaxial or biaxial stretching treatment, if necessary. According to the resin sheet to which thermal contraction property is imparted by a stretching treatment or the like, the adhered area between the pressure-sensitive adhesive layer 32 and the adhesive layer 2 is reduced by thermal contraction of the base material 31 after dicing and thus the recovery of the semiconductor chip can be facilitated.

A commonly used surface treatment, e.g., a chemical or physical treatment such as a chromate treatment, ozone exposure, flame exposure, exposure to high-voltage electric shock, or an ionized radiation treatment, or a coating treatment with an undercoating agent e.g., a pressure-sensitive adhesive substance to be mentioned later) may be applied onto the surface of the base material 31 in order to enhance close adhesiveness with the adjacent layer, holding properties, and the like.

As the base material 31, the same kind or different kinds of materials can be suitably selected and used and, if necessary, several kinds of materials can be blended and used. Moreover, to the base material 31, for imparting antistatic ability, a vapor deposition layer of a conductive substance having a thickness of about 30 to 500 angstrom, which is composed of a metal, alloy or an oxide thereof, can be formed on the base material 31. The base material 31 may be a single layer or a multilayer of two or more thereof.

The thickness (total thickness in the case of the laminated layer) of the base material 31 is not particularly restricted and can be appropriately selected depending on strength, flexibility, intended purpose of use, and the like. For example, the thickness is generally 1,000 µm or less (e.g., 1 µm to 1,000 µm), preferably 10 µm to 500 µm, further preferably 20 µm to 300 µm, and particularly preferably about 30 µm to 200 µm but is not limited thereto.

Incidentally, the base material 31 may contain various additives (a coloring agent, a filler, a plasticizer, an antiaging agent, an antioxidant, a surfactant, a flame retardant, etc.) within the range where the advantages and the like of the invention are not impaired.

The pressure-sensitive adhesive layer 32 is formed of a pressure-sensitive adhesive and has an pressure-sensitive adhesiveness. Not specifically defined, the pressure-sensitive adhesive may be suitably selected from known pressure-sensitive adhesives. Concretely, as the pressure-sensitive adhesive, for example, those having the above-mentioned characteristics are suitably selected from known pressure-sensitive adhesives such as acrylic pressure-sensitive adhesives, rubber-based pressure-sensitive adhesives, vinyl alkyl ether-based pressure-sensitive adhesives, silicone-based pressure-sensitive adhesives, polyester-based pressure-sensitive adhesives, polyamide-based pressure-sensitive adhesives, urethane-based pressure-sensitive adhesives, fluorine-based pressure-sensitive adhesives, styrene-diene block copolymer-based pressure-sensitive adhesives, and creep characteristics-improved pressure-sensitive adhesives prepared by incorporating a thermofusible resin having a melting point of not higher than 200° C. to the above-mentioned pressure-sensitive adhesive (for example, see JP-A 56-61468, JP-A-61-174857, JP-A-63-17981, JP-A-56-13040, herein incorporated by reference), and are used herein. As the pressure-sensitive adhesive, also usable here are radiation-curable pressure-sensitive adhesives (or energy ray-curable pressure-sensitive adhesives) and thermally expandable pressure-sensitive adhesives. One or more such pressure-sensitive adhesives may be used here either singly or as combined.

As the pressure-sensitive adhesive, preferred for use herein are acrylic pressure-sensitive adhesives and rubber-based pressure-sensitive adhesives, and more preferred are acrylic pressure-sensitive adhesives. The acrylic pressure-sensitive adhesives include those comprising, as the base polymer, an acrylic polymer (homopolymer or copolymer) of one or more alkyl(meth)acrylates as monomer component(s).

The alkyl(meth)acrylate for the acrylic pressure-sensitive adhesive includes, for example, methyl(meth)acrylate, ethyl (meth)acrylate, propyl(meth)acrylate, isopropyl(meth)acrylate, butyl(meth)acrylate, isobutyl(meth)acrylate, s-butyl (meth)acrylate, t-butyl(meth)acrylate, pentyl(meth)acrylate, hexyl(meth)acrylate, heptyl(meth)acrylate, octyl(meth)acrylate, 2-ethylhexyl(meth)acrylate, isooctyl (meth)acrylate, nonyl(meth)acrylate, isononyl(meth)acrylate, decyl(meth) acrylate, isodecyl(meth)acrylate, undecyl(meth)acrylate, dodecyl(meth)acrylate, tridecyl (meth)acrylate, tetradecyl (meth)acrylate, pentadecyl(meth)acrylate, hexadecyl (meth) acrylate, heptadecyl(meth)acrylate, octadecyl(meth)acrylate, nonadecyl (meth)acrylate, eicosyl(meth)acrylate, etc. As the alkyl(meth)acrylate, preferred are those in which the alkyl group has from 4 to 18 carbon atoms. In the alkyl (meth) acrylate, the alkyl group may be linear or branched.

The acrylic polymer may contain, if desired, a unit corresponding to any other monomer component copolymerizable with the above-mentioned alkyl(meth)acrylate (copolymerizable monomer component), for the purpose of improving the cohesive force, the heat resistance and the crosslinkability thereof. The copolymerizable monomer component includes, for example, carboxyl group-containing monomers such as (meth)acrylic acid (acrylic acid, methacrylic acid), carboxyethyl acrylate, carboxypentyl acrylate, itaconic acid, maleic acid, fumaric acid, crotonic acid; acid anhydride group-containing monomers such as maleic anhydride, itaconic anhydride; hydroxyl group-containing monomers such as hydroxyethyl(meth)acrylate, hydroxypropyl(meth)acrylate, hydroxybutyl(meth)acrylate, hydroxyhexyl (meth)acrylate, hydroxyoctyl(meth)acrylate, hydroxydecyl(meth)acrylate, hydroxylauryl(meth)acrylate, (4-hydroxymethylcyclohexyl) methyl methacrylate; sulfonic acid group-containing monomers such as styrenesulfonic acid, allylsulfonic acid, 2-(meth)acrylamide-2-methylpropanesulfonic acid, (meth) acrylamide-propanesulfonic acid, sulfopropyl(meth)acrylate, (meth)acryloyloxynaphthalenesulfonic acid; phosphoric acid group-containing monomers such as 2-hydroxyethyl acryloylphosphate; (N-substituted) amide monomers such as (meth)acrylamide, N,N-dimethyl(meth)acrylamide, N-butyl (meth)acrylamide, N-methylol(meth)acrylamide, N-methylolpropane(meth)acrylamide; aminoalkyl(meth)acrylate monomers such as aminoethyl(meth)acrylate, N,N-dimethylaminoethyl(meth)acrylate, t-butylaminoethyl (meth)acrylate; alkoxyalkyl(meth)acrylate monomers such as methoxyethyl (meth)acrylate, ethoxyethyl(meth)acrylate; cyanoacrylate monomers such as acrylonitrile, methacrylonitrile; epoxy group-containing acrylic monomers such as glycidyl(meth)acrylate; styrene monomers such as styrene, α-methylstyrene; vinyl ester monomers such as vinyl acetate, vinyl propionate; olefin monomers such as isoprene, butadiene, isobutylene; vinyl ether monomers such as vinyl ether; nitrogen-containing monomers such as N-vinylpyrrolidone, methylvinylpyrrolidone, vinylpyridine, vinylpiperidone, vinylpyrimidine, vinylpiperazine, vinylpyrazine, vinylpyrrole, vinylimidazole, vinyloxazole, vinylmorpholine, N-vinylcarbonamides, N-vinylcaprolactam; maleimide monomers such as N-cyclohexylmaleimide, N-isopropylmaleimide, N-laurylmaleimide, N-phenylmaleimide; itaconimide monomers such as N-methylitaconimide, N-ethylitaconimide, N-butylitaconimide, N-octylitaconimide, N-2-ethylhexylitaconimide, N-cyclohexylitaconimide, N-laurylitaconimide; succinimide monomers such as N-(meth)acryloyloxymethylenesuccinimide, N-(meth)acryloyl-6-oxyhexamethylenesuccinimide, N-(meth)acryloyl-8-oxyoctamethylenesuccinimide; acryl glycolate monomers such as polyethylene glycol(meth)acrylate, polypropylene glycol(meth)acrylate, methoxyethylene glycol(meth)acrylate, methoxypolypropylene glycol(meth)acrylate; acrylate monomers having a hetero ring, a halogen atom, a silicone atom or the like such as tetrahydrofurfuryl(meth)acrylate, fluoro(meth)acrylate, silicone(meth)acrylate; polyfunctional monomers such as hexanediol di(meth)acrylate, (poly)ethylene glycol di(meth)acrylate, (poly)propylene glycol di(meth) acrylate, neopentylglycol di(meth)acrylate, pentaerythritol di(meth)acrylate, trimethylolpropane tri(meth)acrylate, pentaerythritol tri(meth)acrylate, dipentaerythritol hexa(meth) acrylate, epoxyacrylate, polyester acrylate, urethane acrylate, divinylbenzene, butyl di(meth)acrylate, hexyl di(meth)acrylate, etc. One or more these copolymerizable monomer components may be used here either singly or as combined.

The radiation-curable pressure-sensitive adhesive (or energy ray-curable pressure-sensitive adhesive) (composition) usable in the invention includes, for example, an internal-type radiation-curable pressure-sensitive adhesive comprising, as the base polymer, a polymer having a radical-reactive carbon-carbon double bond in the polymer side chain, main chain or main chain terminal, and a radiation-curable pressure-sensitive adhesive prepared by incorporating a UV-curable monomer component or oligomer component in a pressure-sensitive adhesive. The thermally expandable pressure-sensitive adhesive also usable here includes, for example, those comprising a pressure-sensitive adhesive and a foaming agent (especially thermally expandable microspheres).

In the invention, the pressure-sensitive adhesive layer 32 may contain various additives (e.g., a tackifying resin, a coloring agent, a thickener, an extender, a filler, a plasticizer, an antiaging agent, an antioxidant, a surfactant, a crosslinking agent, etc.) within the range where the advantages of the invention are not impaired.

The crosslinking agent is not particularly restricted and known crosslinking agents can be used. Specifically, as the crosslinking agent, not only isocyanate-based crosslinking agents, epoxy-based crosslinking agents, melamine-based crosslinking agents, and peroxide-based crosslinking agents but also urea-based crosslinking agents, metal alkoxide-based crosslinking agents, metal chelate-based crosslinking agents, metal salt-based crosslinking agents, carbodiimide-based crosslinking agents, oxazoline-based crosslinking agents, aziridine-based crosslinking agents, amine-based crosslinking agents, and the like may be mentioned, and isocyanate-based crosslinking agents and epoxy-based crosslinking agents are suitable. The crosslinking agent may be employed singly or in a combination of two or more kinds. Incidentally, the amount of the crosslinking agent to be used is not particularly restricted.

Examples of the isocyanate-based crosslinking agents include lower aliphatic polyisocyanates such as 1,2-ethylene diisocyanate, 1,4-butylene diisocyanate, and 1,6-hexamethylene diisocyanate; alicyclic polyisocyanates such as cyclopentylene diisocyanate, cyclohexylene diisocyanate, isophorone diisocyanate, hydrogenated tolylene diisocyanate, and hydrogenated xylylene diisocyanate; and aromatic polyisocyanates such as 2,4-tolylene diisocyanate, 2,6-tolylene diisocyanate, 4,4'-diphenylmethane diisocyanate, and xylylene diisocyanate. In addition, a trimethylolpropane/tolylene diisocyanate trimer adduct [a trade name "COLONATE L" manufactured by Nippon Polyurethane Industry Co., Ltd.], a trimethylolpropane/hexamethylene diisocyanate trimer adduct [a trade name "COLONATE HL" manufactured by Nippon Polyurethane Industry Co., Ltd.], and the like are also used. Moreover, examples of the epoxy-based crosslinking agents include N,N,N',N'-tetraglycidyl-m-xylenediamine, diglycidylaniline, 1,3-bis(N,N-glycidy-laminomethyl)cyclohexane, 1,6-hexanediol diglycidyl ether, neopentyl glycol diglycidyl ether, ethylene glycol diglycidyl ether, propylene glycol diglycidyl ether, polyethylene glycol diglycidyl ether, polypropylene glycol diglycidyl ether, sorbitol polyglycidyl ether, glycerol polyglycidyl ether, pentaerythritol polyglycidyl ether, polyglycerol polyglycidyl ether, sorbitan polyglycidyl ether, trimethylolpropnane polyglycidyl ether, adipic acid diglycidyl ester, o-phthalic acid diglycidyl ester, triglycidyl-tris(2-hydroxyethyl)isocyanurate, resorcin diglycidyl ether, and bisphenol-S-diglycidyl ether, and also epoxy-based resins having two or more epoxy groups in the molecule.

In place of using the crosslinking agent or along with the crosslinking agent in the invention, the pressure-sensitive adhesive layer may be crosslinked through irradiation with electron rays or UV rays.

The pressure-sensitive adhesive layer 32 can be, for example, formed by utilizing a commonly used method including mixing a pressure-sensitive adhesive and optional solvent and other additives and then shaping the mixture into a sheet-like layer. Specifically, for example, there may be mentioned a method including applying a mixture containing a pressure-sensitive adhesive and optional solvent and other additives on the base material 31; a method including applying the foregoing mixture on an appropriate separator (such as a release paper) to form a pressure-sensitive adhesive layer 32 and then transferring (transcribing) it on the base material 31; or the like.

The thickness of the pressure-sensitive adhesive layer 32 is not particularly restricted and, for example, is preferably about 5 μm to 300 μm, preferably 5 μm to 200 μm, further preferably 5 μm to 100 μm, and particularly preferably 7 μm to 50 μm. When the thickness of the pressure-sensitive adhesive layer 32 is within the above-mentioned range, an appropriate pressure-sensitive adhesive force can be exhibited. The pressure-sensitive adhesive layer may be either a single layer or a multi layer.

The adhesive force of the pressure-sensitive adhesive layer 32 of the dicing tape 3 to the adhesive layer 2 (23° C., peeling angle of 180 degrees, peeling rate of 300 mm/min) is preferably within a range of from 0.02 N/20 mm to 10 N/20 mm, more preferably from 0.05 N/20 mm to 5 N/20 mm. When the adhesive force is at least 0.02 N/20 mm, then the semiconductor chips may be prevented from flying away in dicing semiconductor wafer. On the other hand, when the adhesive force is at most 10 N/20 mm, then it facilitates peeling of semiconductor chips in picking up them, and prevents the pressure-sensitive adhesive from remaining.

Incidentally, in the invention, the adhesive layer 2 or the adhesive layer-attached dicing tape 1 can be made to have an antistatic function. Owing to this configuration, the circuit can be prevented from breaking down due to the generation of electrostatic energy at the time adhesion and at the time of peeling thereof or due to charging of a semiconductor wafer or the like by the electrostatic energy. Imparting of the antistatic function can be performed by an appropriate manner such as a method of adding an antistatic agent or a conductive substance to the base material 31, the pressure-sensitive adhesive layer 32, and the adhesive layer 2, or a method of providing a conductive layer composed of a charge-transfer complex, a metal film, or the like onto the base material 31. As these methods, a method in which an impurity ion having a fear of changing quality of the semiconductor wafer is difficult to generate is preferable. Examples of the conductive substance (conductive filler) to be blended for the purpose of imparting conductivity, improving thermal conductivity, and the like include a sphere-shaped, a needle-shaped, or a flake-shaped metal powder of silver, aluminum, gold, copper, nickel, a conductive alloy, or the like; a metal oxide such as alumina; amorphous carbon black, and graphite. However, the adhesive layer 2 is preferably non-conductive from the viewpoint of having no electric leakage.

Moreover, the film for semiconductor device production 40 may be formed in a form where it is wound as a roll or may be formed in a form where the sheet (film) is laminated. In this regard, the film for semiconductor device production 40 in the state or form where it is wound as a roll may be constituted by the base material 31, the pressure-sensitive adhesive layer 32 formed on one surface of the base material 31, the adhesive layer 2 formed on the pressure-sensitive adhesive layer 32, and a releasably treated layer (rear surface treated layer) formed on the other surface of the base material 31.

Incidentally, the thickness of the adhesive layer-attached dicing tape 1 (total thickness of the thickness of the adhesive layer and the thickness of the dicing tape including the base material 31 and the pressure-sensitive adhesive layer 32) can be, for example, selected from the range of 8 μm to 1,500 μm, and it is preferably from 20 μm to 850 μm, more preferably 31 μm to 500 μm, and particularly preferably 47 μm to 330 μm.

The ratio of the thickness of the adhesive layer 2 to the thickness of the pressure-sensitive adhesive layer 32 of the dicing tape 3 is not specifically defined. For example, the ratio may be suitably selected from a range of (thickness of adhesive layer 2/thickness of pressure-sensitive adhesive layer 32 of dicing tape 3)=from 150/5 to 3/100, preferably from 100/5 to 3/50, more preferably from 60/5 to 3/40. When the ratio of the thickness of the adhesive layer 2 to the thickness of the pressure-sensitive adhesive layer 32 of the dicing tape 3 is at least 3/100, then the adhesive force between the two can be prevented from being too high. On the other hand, when the ratio is at most 150/5, then the adhesive force may be prevented from being too low.

The ratio of the thickness of the adhesive layer 2 to the thickness of the dicing tape 3 (total thickness of the base material 31 and the pressure-sensitive adhesive layer 32) is not specifically defined. For example, the ratio may be suitably selected from a range of (thickness of adhesive layer 2/thickness of dicing tape 3)=from 150/50 to 3/500, preferably from 100/50 to 3/300, more preferably from 60/50 to 3/150. When the ratio of the thickness of the adhesive layer 2 to the thickness of the dicing tape 3 is at least 3/500, then it facilitates picking up the tape. On the other hand, when the ratio is at most 150/50, then it prevents side residues from increasing in dicing.

In this regard, by controlling the ratio of the thickness of the adhesive layer 2 to the thickness of the pressure-sensitive adhesive layer 32 of the dicing tape 3 or the ratio of the thickness of the adhesive layer 2 to the thickness of the dicing tape (total thickness of the base material 31 and the pressure-sensitive adhesive layer 32), the dicing property at the dicing step, the picking-up property at the picking-up step, and the like can be improved and the film for semiconductor device production of the invention can be thereby effectively utilized from the dicing step for semiconductor wafer to the flip chip bonding step for semiconductor chips.

(Producing Method of Film for Semiconductor Device Production)

The producing method of the film for semiconductor device production according to the present embodiment is described while using the film for semiconductor device production 40 shown in FIGS. 1A and 1B as an example. The method for producing the film for semiconductor device production 40 of this embodiment comprises a step of preparing a separator-attached film that comprises a separator 42, and adhesive layer-attached dicing tapes 1 each comprising a dicing tape 3 and an adhesive layer 2 laminated on the dicing tape 3, which are laminated on the separator 42 via the adhesive layer 2 serving as the attaching face; and a step of cutting the separator-attached film in accordance with the size corresponding to the semiconductor wafer to which the film is stuck. In the method, the film is cut to the depth of at most ⅔ of the thickness of the separator 42 from the side of the dicing tape 3.

First, the base material 31 can be formed by a conventionally known film-forming method. Examples of the film-forming method include a calendar film-forming method, a casting method in an organic solvent, an inflation extrusion method in a closely sealed system, a T-die extrusion method, a co-extrusion method, and a dry laminating method.

Next, the pressure-sensitive adhesive composition is applied to the base material 31 and dried thereon (and optionally crosslinked under heat) to form the pressure-sensitive adhesive layer 32. The coating system includes roll coating, screen coating, gravure coating, etc. The pressure-sensitive adhesive layer composition may be directly applied to the base material 31 to form the pressure-sensitive adhesive layer 32 on the base material 31; or the pressure-sensitive adhesive composition may be applied to a release sheet or the like of which the surface has been processed for lubrication, to form the pressure-sensitive adhesive layer 32 thereon, and the pressure-sensitive adhesive layer 32 may be transferred onto the base material 31. With that, the dicing tape 3 is formed having the pressure-sensitive adhesive layer 32 formed on the base material 31.

On the other hand, a forming material for forming the adhesive layer 2 is applied onto a release sheet to form a coating layer having a predetermined thickness after dried, and then dried under a predetermined condition (optionally heated in case where thermal curing is necessary, and dried) to form the coating layer. Subsequently, the coating layer is dried under a predetermined condition to thereby form the adhesive layer 2.

Next, the adhesive layer 2 is blanked out in accordance with the shape of the semiconductor wafer to be attached thereto, and is then attached to the dicing tape 3. Subsequently, this is laminated on the separator 42 via the adhesive layer 2 serving as the attaching face thereby giving a separator-attached film. The separator 42 can be produced according to a known film formation method. The film formation method includes, for example, a calender film formation method, a casting method in an organic solvent, an inflation extrusion method in a closed system, a T-die extrusion method, a coextrusion method, a dry lamination method.

Next, the separator-attached film is cut in accordance with the size corresponding to the semiconductor wafer to which the film is stuck. In the step, the film is cut to the depth of at most ⅔ of the thickness of the separator 42 from the side of the dicing tape 3 (see FIG. 1B). With that, there is obtained the film for semiconductor device production 40, in which the separator 42 is cut around the outer periphery of the dicing tape 3 and the depth of the cut is at most ⅔ of the thickness of the separator 42. Not blanked out, the adhesive layer 2 may be attached to the dicing tape 3 directly as it is, and then laminated on the separator still directly as it is, and thereafter, the separator-attached film may be cut in accordance with the size corresponding to the semiconductor wafer to which the film is stuck. In this case, the adhesive layer 2 and the dicing tape 3 are cut and, at the same time, the cut 44 is formed.

The method of forming the cut is not specifically defined. For example, herein employable are a method of using a rotary, a method of using a blanking blade (for example, Thomson blade), a laser working method. Above all, a rotary is favorable as increasing the accuracy level of the depth of the cut to be formed. In case where a blanking blade is used, preferably, a spacer is provided inside and/or outside the blade. With that, the accuracy level of the depth of the cut to be formed can be increased. Incidentally, heretofore, where the separator is cut merely with a blanking blade, the accuracy is low and in some cases, a cut having a depth larger than ⅔ of the thickness of the separator may be often formed. Contrary to this, the blade could not reach the separator and the dicing tape could not also be cut in some other cases. However, when a rotary is used or when a spacer is provided inside and/or outside the blade, then the accuracy level of the depth of the cut to be formed can be increased.

(Semiconductor Wafer)

The semiconductor wafer is not particularly restricted as long as it is a known or commonly used semiconductor wafer and can be appropriately selected and used among semiconductor wafers made of various materials. In the invention, as the semiconductor wafer, a silicon wafer can be suitable used.

(Production Method for Semiconductor Device)

The production method for a semiconductor device of this embodiment is described with reference to FIGS. 2A to 2D. FIGS. 2A to 2D are schematic cross-sectional views showing one example of the method for producing a semiconductor device that uses the adhesive layer-attached dicing tape of this embodiment.

In the semiconductor device production method, used is the film for semiconductor device production 40 to produce a semiconductor device. Concretely, the method comprises at least a step of peeling the separator 42 from the film for semiconductor device production 40, and a step of attaching a semiconductor wafer onto the adhesive layer 2.

First, the film for semiconductor device production 40, as shown in FIG. 1A and FIG. 1B, is prepared, and the separator 42 is peeled from the film for semiconductor device production 40. In the film for semiconductor device production 40 is, as described in the above, the separator 42 is processed to have a cut formed therein, and the depth of the cut of the separator 42 is at most ⅔ of the thickness of the separator 42. Accordingly, when the separator 42 is peeled from the film for semiconductor device production 40, the separator 42 is prevented from being torn from the cut thereof. The peeling rate may be from 1 to 100 mm/sec.

[Mounting Step]

Figure 2A:
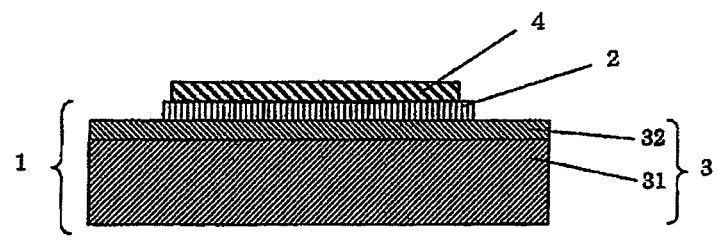
FIG. 2A to 2D are schematic cross-sectional views showing one example of the method for producing a semiconductor device that uses the adhesive layer-attached dicing tape of the invention.

As shown in FIG. 2A, a semiconductor wafer 4 is attached onto the adhesive layer 2 of the adhesive layer-attached dicing tape 1, and fixed thereon by adhesion (mounting step). On this occasion, the adhesive layer 2 is in an uncured state (including a semi-cured state). The adhesive layer-attached dicing tape 1 is attached to the back surface of the semiconductor wafer 4. The back surface of the semiconductor wafer 4 means the face opposite to the circuit face (also referred to as non-circuit face, non-electrode-formed face, etc.). The attaching method is not particularly restricted but a method by press bonding is preferred. The press bonding is usually performed while pressing with a pressing means such as a pressing roll.

(Dicing Step)

Figure 2B:
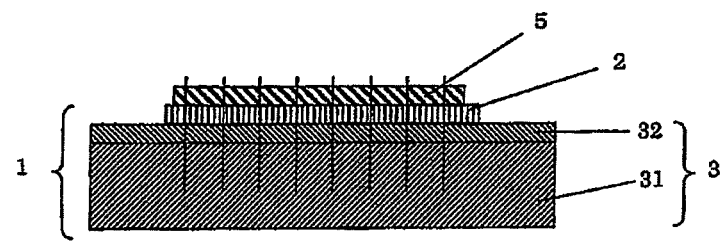

Next, as shown in FIG. 2B, the semiconductor wafer 4 is diced. Thereby, the semiconductor wafer 4 is cut into a prescribed size and individualized (is formed into small pieces) to produce semiconductor chips 5. The dicing is performed according to a normal method from the circuit face side of the semiconductor wafer 4, for example. Moreover, the present step can adopt, for example, a cutting method called full-cut that forms a cut reaching the adhesive layer-attached dicing tape 1. The dicing apparatus used in the present step is not particularly restricted, and a conventionally known apparatus can be used. Further, since the semiconductor wafer 4 is adhered and fixed by the adhesive layer-attached dicing tape 1 having the adhesive layer 2, chip crack and chip fly can be suppressed, as well as the damage of the semiconductor wafer 4 can also be suppressed. In this regard, when the adhesive layer 2 is formed of a resin composition containing an epoxy resin, generation of adhesive extrusion from the adhesive layer can be suppressed or prevented at the cut surface even when it is cut by dicing. As a result, re-attachment (blocking) of the cut surfaces themselves can be suppressed or prevented and thus the picking-up to be mentioned below can be further conveniently performed.

In the case where the adhesive layer-attached dicing tape 1 is expanded, the expansion can be performed using a conventionally known expanding apparatus. The expanding apparatus has a doughnut-shaped outer ring capable of pushing the adhesive layer-attached dicing tape 1 downward through a dicing ring and an inner ring which has a diameter smaller than the outer ring and supports the adhesive layer-attached dicing tape. Owing to the expanding step, it is possible to prevent the damage of adjacent semiconductor chips through contact with each other in the picking-up step to be mentioned below.

(Picking-Up Step)

Figure 2C:
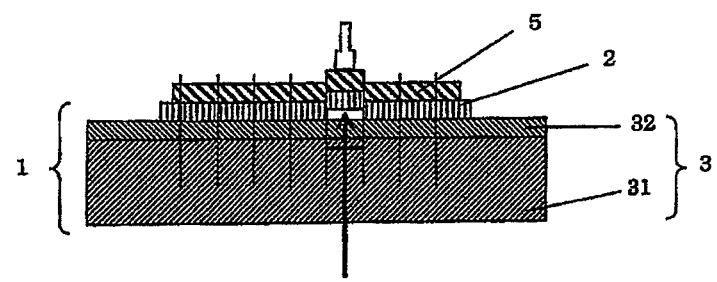

In order to collect the semiconductor chip 5 that is adhered and fixed to the adhesive layer-attached dicing tape 1, picking-up of the semiconductor chip 5 is performed as shown in FIG. 2C to peel the semiconductor chip 5 together with the adhesive layer 2 from the dicing tape 3. The method of picking-up is not particularly restricted, and conventionally known various methods can be adopted. For example, there may be mentioned a method including pushing up each semiconductor chip 5 from the base material 31 side of the adhesive layer-attached dicing tape 1 with a needle and picking-up the pushed semiconductor chip 5 with a picking-up apparatus. In this regard, the back surface of the picked-up semiconductor chip 5 is protected with the adhesive layer 2.

(Flip Chip Connection Step)

Figure 2D:
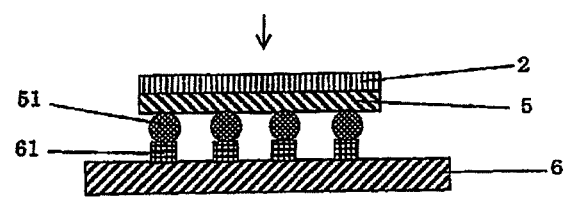

The picked-up semiconductor chip 5 is fixed to an adherend 6 such as a substrate by a flip chip bonding method (flip chip mounting method) as shown in FIG. 2D. Specifically, the semiconductor chip 5 is fixed to the adherend 6 according to a usual manner in a form where the circuit face (also referred to as a front face, circuit pattern-formed face, electrode-formed face, etc.) of the semiconductor chip 5 is opposed to the adherend 6. For example, the bump 51 formed at the circuit face side of the semiconductor chip 5 is brought into contact with a conductive material 61 (such as solder) for conjution attached to a connecting pad of the adherend 6 and the conductive material 61 is melted under pressing, whereby electric connection between the semiconductor chip 5 and the adherend 6 can be secured and the semiconductor chip 5 can be fixed to the adherend 6 (flip chip bonding step). On this occasion, gaps are formed between the semiconductor chip 5 and the adherend 6 and the distance between the gaps is generally about 30 μm to 300 μm. In this regard, after the flip chip bonding (flip chip connecting) of the semiconductor chip 5 on the adherend 6, it is important that the opposing faces of the semiconductor chip 5 and the adherend 6 and the gaps are washed and an encapsulating material (such as an encapsulating resin) is then filled into the gaps to perform encapsulation.

As the adherend 6, various substrates such as lead frames and circuit boards (such as wiring circuit boards) can be used. The material of the substrates is not particularly restricted and there may be mentioned ceramic substrates and plastic substrates. Examples of the plastic substrates include epoxy substrates, bismaleimide triazine substrates, and polyimide substrates.

In the flip chip bonding step, the material of the bump and the conductive material is not particularly restricted and examples thereof include solders (alloys) such as tin-lead-based metal materials, tin-silver-based metal materials, tin-silver-copper-based metal materials, tin-zinc-based metal materials, and tin-zinc-bismuth-based metal materials, and gold-based metal materials and copper-based metal materials.

Incidentally, in the flip chip bonding step, the conductive material is melted to connect the bump at the circuit face side of the semiconductor chip 5 and the conductive material on the surface of the adherend 6. The temperature at the melting of the conductive material is usually about 260° C. (e.g., 250° C. to 300° C.). The adhesive layer-attached dicing tape of the invention can be made to have thermal resistance capable of enduring the high temperature in the flip chip bonding step by forming the adhesive layer with an epoxy resin or the like.

In the present step, it is preferred to wash the opposing face (electrode-formed face) between the semiconductor chip 5 and the adherend 6 and the gaps. The washing liquid to be used at the washing is not particularly restricted and examples thereof include organic washing liquids and aqueous washing liquids. The adhesive layer in the adhesive layer-attached dicing tape of the invention has solvent resistance against the washing liquid and has substantially no solubility to these washing liquid. Therefore, as mentioned above, various washing liquids can be employed as the washing liquid and the washing can be achieved by any conventional method without requiring any special washing liquid.

Next, an encapsulation step is performed for encapsulating the gaps between the flip chip-bonded semiconductor chip 5 and the adherend 6. The encapsulation step is performed using an encapsulating resin. The encapsulation conditions on this occasion are not particularly restricted but the curing of the encapsulating resin is usually carried out at 175° C. for 60 seconds to 90 seconds. However, in the invention, without limitation thereto, the curing may be performed at a temperature of 165 to 185° C. for several minutes, for example. By the thermal treatment in this step, not only the encapsulating resin but also the adhesive layer 2 is also thermally cured at the same time. Accordingly, both the encapsulating resin and adhesive layer 2 are cured and shrunk with the procedure of the thermal curing. As a result, the stress to be given to the semiconductor chip 5 owing to the curing shrinkage of the encapsulating resin can be cancelled or relaxed through curing shrinkage of the adhesive layer 2. Moreover, in the step, the adhesive layer 2 can be completely or almost completely thermally cured and can be attached to the back surface of the semiconductor element with excellent close adhesiveness. Further, the adhesive layer 2 according to the invention can be thermally cured together with the encapsulating material in the encapsulation step even when the film is in an uncured state, so that it is not necessary to newly add a step for thermal curing of the adhesive layer 2.

The encapsulating resin is not particularly restricted as long as the material is a resin having an insulating property (an insulating resin) and may be suitably selected and used among known encapsulating materials such as encapsulating resins. The encapsulating resin is preferably an insulating resin having elasticity. Examples of the encapsulating resin include resin compositions containing an epoxy resin. As the epoxy resin, there may be mentioned the epoxy resins exemplified in the above. Furthermore, the encapsulating resin composed of the resin composition containing an epoxy resin may contain a thermosetting resin other than an epoxy resin (such as a phenol resin) or a thermoplastic resin in addition to the epoxy resin. Incidentally, a phenol resin can be utilized also as a curing agent for the epoxy resin and, as such a phenol resin, there may be mentioned phenol resins exemplified in the above.

The above embodiment includes an adhesive layer-attached dicing tape comprising an adhesive layer laminated on a dicing tape, and a film for semiconductor device production comprising the adhesive layer-attached dicing tapes laminated with a separator. However, in the film for semiconductor device production of the invention, an adhesive layer may not be laminated. Specifically, the film for semiconductor device production of the invention may comprise a separator and a plurality of dicing tapes laminated on the separator at predetermined interval(s). In this case, the production method for the film for semiconductor device production comprises a step of preparing a separator-attached film that comprises dicing tapes laminated on a separator, an a step of cutting the separator-attached film in accordance with the size corresponding to the semiconductor wafer to which the film is stuck, wherein the film is cut to the depth of at most ⅔ of the thickness of the separator from the side of the dicing tape. The method for producing a semiconductor device by using the film for semiconductor device production in which dicing tapes are laminated on a separator at predetermined intervals may comprise at least a step of peeling the separator from the film for semiconductor device production, and a step of attaching a semiconductor wafer onto the dicing tape. The step of attaching a semiconductor wafer onto the dicing tape may be followed by, for example, a step of dicing the semiconductor wafer, a step of picking up the semiconductor chip obtained by dicing, and a step of flip chip-bonding the semiconductor chip onto an adherend to thereby produce a semiconductor device.

According to the semiconductor device (flip chip-mounted semiconductor device) manufactured using the adhesive layer-attached dicing tape 1, the adhesive layer is attached to the back surface of the semiconductor chip, and therefore, laser marking can be applied with excellent visibility. In particular, even when the marking method is a laser marking method, laser marking can be applied with an excellent contrast ratio, and it is possible to observe various kinds of information (for example, literal information and graphical information) applied by laser marking with good visibility. At the laser marking, a known laser marking apparatus can be utilized. Moreover, as the laser, it is possible to utilize various lasers such as a gas laser, a solid-state laser, and a liquid laser. Specifically, as the gas laser, any known gas lasers can be utilized without particular limitation but a carbon dioxide laser ($CO_2$ laser) and an excimer laser (ArF laser, KrF laser, XeCl laser, XeF laser, etc.) are suitable. As the solid-state laser, any known solid-state lasers can be utilized without particular limitation but a YAG laser (such as Nd:YAG laser) and a $YVO_4$ laser are suitable.

Since the semiconductor device produced using the adhesive layer-attached dicing tape of the invention is a semiconductor device mounted by the flip chip mounting method, the device has a thinned and miniaturized shape as compared with a semiconductor device mounted by a die-bonding mounting method. Thus, the semiconductor devices can be suitably employed as various electronic devices and electronic parts or materials and members thereof. Specifically, as the electronic devices in which the flip chip-mounted semiconductor devices of the invention are utilized, there may be mentioned so-called "mobile phones" and "PHS", small-sized computers [e.g., so-called "PDA" (handheld terminals), so-called "notebook-sized personal computer", so-called "Net Book (trademark)", and so-called "wearable computers", etc.], small-sized electronic devices having a form where a "mobile phone" and a computer are integrated, so-called "Digital Camera (trademark)", so-called "digital video cameras", small-sized television sets, small-sized game machines, small-sized digital audio players, so-called "electronic notepads", so-called "electronic dictionary", electronic device terminals for so-called "electronic books", mobile electronic devices (portable electronic devices) such as small-sized digital type watches, and the like. Needless to say, electronic devices (stationary type ones, etc.) other than mobile ones, e.g., so-called "desktop personal computers", thin type television sets, electronic devices for recording and reproduction (hard disk recorders, DVD players, etc.), projectors, micromachines, and the like may be also mentioned. In addition, electronic parts or materials and members for electronic devices and electronic parts are not particularly restricted and examples thereof include parts for so-called "CPU" and members for various memory devices (so-called "memories", hard disks, etc.).

The above embodiment is for using the film for semiconductor device production in production of a flip chip type semiconductor device. However, the film for semiconductor device production of the invention is not limited to the embodiment but may be used in production of other semiconductor devices than flip chip type semiconductor devices. For example, after the separator is peeled from the film for semiconductor device production, the adhesive layer of the adhesive layer-attached dicing tape may be attached to the surface of a semiconductor wafer (semiconductor chip) in another use of the film. In this case, the adhesive layer-attached dicing tape that the film for semiconductor device production has may be used as an ordinary known dicing/die-bonding film.

EXAMPLES

The following will illustratively describe preferred Examples of the invention in detail. However, the invention is not limited to the following Examples unless it exceeds the gist thereof. Moreover, part in each example is a weight standard unless otherwise stated.

Example 1

<Preparation of Adhesive Layer>

113 parts of an epoxy resin (trade name "EPICOAT 1004" manufactured by JER Co., Ltd.), 121 parts of a phenolic resin (trade name "MILEX XLC-4L" manufactured by Mitsui Chemicals, Inc.), 246 parts of sphere silica (trade name "SO-25R" manufactured by Admatechs Co., Ltd.), 5 parts of Dye 1 (trade name "OIL GREEN 502" manufactured by Orient Chemical Industries Co., Ltd.), and 5 parts of Dye 2 (trade name "OIL BLACK BS" manufactured by Orient Chemical Industries Co., Ltd.) based on 100 parts of an acrylate-based polymer (trade name "PARACRON W-197CM" manufactured by Negami Chemical Industrial Co., Ltd.) containing ethyl acrylate and methyl methacrylate as main components were dissolved in methyl ethyl ketone to prepare a solution of a paste composition having a solid concentration of 23.6% by weight.

The solution of the paste composition was applied onto a separator of a polyethylene terephthalate film having a thickness of 50 μm, which had been subjected to a silicone-releasing treatment, and then dried at 130° C. for 2 minutes to prepare a film A with an adhesive layer A having a thickness (average thickness) of 20 μm laminated on the separator.

<Preparation of Film for Semiconductor Device Production>
1. Preparation of Separator-Attached Film:

Using a hand roller, the film A was attached to the pressure-sensitive adhesive layer of a dicing tape (trade name "V-8-T" manufactured by Nitto Denko Co., Ltd.; average thickness of the base material, 65 μm; average thickness of the pressure-sensitive adhesive layer, 10 μm) to prepare a separator-attached film A with the adhesive layer-attached dicing tape laminated on the separator.

2. Precutting:

Using a circular Thomson blade, the separator-attached film A was precut to give a film for semiconductor device production. The precutting depth was controlled by introducing a spacer inside and outside the Thomson blade. Concretely, the spacer was introduced so that the cutting depth into the separator could be 13 μm.

In the film for semiconductor device production of Example 1, the thickness of the adhesive layer (average thickness) is 20 μm. In the dicing tape (trade name "V-8-T" manufactured by Nitto Denko Co., Ltd.), the thickness (average thickness) of the base material is 65 μm, the thickness (average thickness) of the pressure-sensitive adhesive layer is 10 μm, and the total thickness of the tape is 75 μm. Accordingly, in the film for semiconductor device production of Example 1, the ratio (ratio of average thickness) of the thickness of the adhesive layer to the thickness of the pressure-sensitive adhesive layer of the dicing tape is 20/10; and the ratio (ratio of average thickness) of the thickness of the adhesive layer to the thickness of the dicing tape (total thickness of the base material and the pressure-sensitive adhesive layer) is 20/75.

Example 2

A film for semiconductor device production of Example 2 was prepared in the same manner as in Example 1, in which, however, the spacer was introduced so that the cutting depth in the separator in precutting could be 20 μm.

Comparative Example 1

A film for semiconductor device production of Comparative Example 1 was prepared in the same manner as in Example 1, in which, however, the spacer was introduced so that the cutting depth in the separator in precutting could be 27 μM.

<Evaluation>

The films for semiconductor device production of Example 1, Example 2 and Comparative Example 1 were tested for the separator releasability thereof, as follows.

A semiconductor wafer (diameter 8 inches, thickness 0.6 mm; silicon mirror wafer) was polished on the back surface thereof to give a mirror wafer having a thickness of 0.2 mm, which was used as a workpiece. With peeling the separator from the film for semiconductor device production, the mirror wafer (workpiece) was attached onto the adhesive layer by roller press-bonding at 70° C. The semiconductor wafer polishing condition and the attaching condition are as follows.

(Conditions for Semiconductor Wafer Grinding)
Grinding apparatus: a trade name "DFG-8560" manufactured by DISCO Corporation
Semiconductor wafer: 8 inch diameter (back surface was ground so as to be until a thickness of 0.2 mm from a thickness of 0.6 mm)

(Attaching Conditions)
Attaching apparatus: a trade name "MA-3000III" manufactured by Nitto Seiki Co., Ltd.
Attaching speed: 10 mm/min
Attaching pressure: 0.15 MPa
Stage temperature at the time of attaching: 70° C.

In wafer mounting, the wafer mountability was evaluated as follows: The samples from which the separator had been peeled well were ranked "Good"; and the samples from which the separator could not been peeled well were ranked "Poor". The results are shown in Table 1.

TABLE 1

|  | Thickness of Separator (μm) | Depth of Cut (μm) | Wafer Mountability |
| --- | --- | --- | --- |
| Example 1 | 38 | 13 | Good |
| Example 2 | 38 | 20 | Good |
| Comparative Example 1 | 38 | 27 | Poor |

From Table 1, the separator was peeled well in the films for semiconductor device production of Examples 1 and 2. On the other hand, in the film for semiconductor device production of Comparative Example 1, the separator was broken from the cut part (cut), and could not be peeled well.

While the present invention has been described in detail and with reference to specific embodiments thereof, it will be apparent to one skilled in the art that various changes and modifications can be made therein without departing from the scope thereof.

This application is based on Japanese patent application No. 2010-169556 filed Jul. 28, 2010, the entire contents thereof being hereby incorporated by reference.

What is claimed is:

1. A film for semiconductor device production, which comprises:
   a separator; and
   a plurality of adhesive layer-attached dicing tapes each comprising a dicing tape comprising a base material and a pressure-sensitive adhesive layer provided on the base material, and an adhesive layer laminated on the pressure-sensitive adhesive layer, wherein the plurality of adhesive layer-attached dicing tapes are laminated on the separator at a predetermined interval in such a manner that the adhesive layer attaches to the separator,
   wherein the separator has a cut formed along the outer periphery of the dicing tape,
   wherein the depth of the cut is at most $\frac{2}{3}$ of the thickness of the separator,
   wherein an outermost circumferential edge of the adhesive layer defines an outermost diameter of the adhesive layer and an outermost circumferential edge of the dicing tape defines an outermost diameter of the dicing tape,
   wherein the outermost diameter of the adhesive layer is smaller than the outermost diameter of the dicing tape, and
   wherein the adhesive layer contains a coloring agent.

2. A method for producing a semiconductor device by using a film for semiconductor device production, the film according to claim 1, the method comprising:
- peeling the separator from the adhesive layer, and
- attaching a semiconductor wafer onto the adhesive layer.

3. A method for producing a film for semiconductor device production, the film according to claim 1, the method comprising:
- preparing a separator-attached film comprising a separator, a plurality of adhesive layer-attached dicing tapes each comprising a dicing tape comprising a base material and a pressure-sensitive adhesive layer provided on the base material, and an adhesive layer laminated on the pressure-sensitive adhesive layer, wherein the plurality of adhesive-attached dicing tapes are laminated on the separator at a predetermined interval in such a manner that the adhesive layer attaches to the separator, and
- cutting the separator along the outer periphery of the dicing tape and in accordance with the size corresponding to a semiconductor wafer to which the film is stuck,
- wherein the separator is cut to the depth of at most $2/3$ of the thickness of the separator from the adhesive layer-attached dicing tape side,
- wherein an outermost circumferential edge of the adhesive layer defines an outermost diameter of the adhesive layer and an outermost circumferential edge of the dicing tape defines an outermost diameter of the dicing tape,
- wherein the outermost diameter of the adhesive layer is smaller than the outermost diameter of the dicing tape, and
- wherein the adhesive layer contains a coloring agent.

\* \* \* \* \*